(12) United States Patent
Sipos et al.

(10) Patent No.: US 10,031,806 B2
(45) Date of Patent: Jul. 24, 2018

(54) EFFICIENT REPAIR OF ERASURE CODED DATA BASED ON COEFFICIENT MATRIX DECOMPOSITION

(71) Applicant: Cisco Technology, Inc., San Jose, CA (US)

(72) Inventors: Márton Ákos Sipos, Budapest (HU); Narayan Venkat, Westford, MA (US); Joshua Bernard Gahm, Newtonville, MA (US); John George Apostolopoulos, Palo Alto, CA (US)

(73) Assignee: Cisco Technology, Inc., San Jose, CA (US)

( * ) Notice: Subject to any disclaimer, the term of this patent is extended or adjusted under 35 U.S.C. 154(b) by 74 days.

(21) Appl. No.: 15/340,128

(22) Filed: Nov. 1, 2016

(65) Prior Publication Data

US 2018/0121286 A1    May 3, 2018

(51) Int. Cl.
*G06F 11/00* (2006.01)
*G06F 11/10* (2006.01)
*H03M 13/15* (2006.01)
*H03M 13/00* (2006.01)

(52) U.S. Cl.
CPC ....... *G06F 11/1076* (2013.01); *H03M 13/154* (2013.01); *H03M 13/616* (2013.01)

(58) Field of Classification Search
USPC ...................................................... 714/6.11
See application file for complete search history.

(56) References Cited

U.S. PATENT DOCUMENTS

| | | | | |
|---|---|---|---|---|
| 2002/0154716 A1* | 10/2002 | Erving | ............... | H04L 1/0057 375/348 |
| 2006/0276212 A1* | 12/2006 | Sampath | ............. | H04B 7/0417 455/513 |
| 2011/0115654 A1* | 5/2011 | Kameyama | ............ | H03M 7/30 341/55 |
| 2014/0298351 A1* | 10/2014 | Usui | ..................... | G06F 17/16 718/107 |

OTHER PUBLICATIONS

D. Papailiopoulos, et al., "Repairing Erasure Codes", In Refereed Work-In-Progress (WiP) and POster at USENIX Conference on File and Storage Technologies (FAST, 2011, 2 pages.
(Continued)

*Primary Examiner* — Sarai E Butler
(74) *Attorney, Agent, or Firm* — Edell, Shapiro & Finnan, LLC

(57) ABSTRACT

A controller device is configured to communicate with storage nodes of a distributed storage system (DSS) in which erasure codes are used to encode source data onto the storage nodes and ranks of matrices containing coding coefficients associated with the erasure codes indicate whether repairs of failed storage nodes of the DSS are feasible. A decomposition structure is generated to be used as a guide for transforming the matrices to upper triangle form (UTF) for use in computing the ranks of the matrices. While the DSS is operating to perform repairs of the failed storage nodes, as part of determining feasible repair strategies that will preserve subsequent repairs of failed storage nodes, the ranks of the matrices are computed by transforming the matrices to UTF using operations on the submatrices according to the decomposition structure.

20 Claims, 17 Drawing Sheets

(56) References Cited

OTHER PUBLICATIONS

B. Chen, et al., "Towards Server-side Repair for Erasure Coding-based Distributed Storage Systems", Proceedings of the 5th ACM Conference on Data and Application Security and Privacy, CODASPY '15, pp. 281-288, ACM, Mar. 2015, 9 pages.

James S. Plank, "Erasure Codes for Storage Systems" A Brief Primer, www.usenix.org, Dec. 2013, vol. 38, No. 6, 8 pages.

K. V. Rashmi, et al., "Enabling Node Repair in Any Erasure Code for Distributed Storage", 2011 IEEE International Symposium on Information Theory Proceedings (ISIT), Jul. 31-Aug. 5, 2011, DOI: 10.1109/ISIT.2011.6033732, 5 pages.

S. Deb, et al., "Data harvesting: A random coding approach to rapid dissemination and efficient storage of data", Jan. 2004, ResearchGate, preprint, https://www.researchgate.net/publication/228662512, 13 pages.

S. Acedański, et al., "Flow Good is Random Linear Coding Based Distributed Networked Storage?", Apr. 2005, In Workshop on Network Coding, Theory and Applications, 6 pages.

T. Ho. et al., "A Random Linear Network Coding Approach to Multicast", IEEE Transactions on Information Theory, vol. 52, No. 10, Oct. 2006, 18 pages.

R. Ahlswede, et al., "Network Information Flow", IEEE Transactions on Information Theory, vol. 46, No. 4, Jul. 2000, 13 pages.

N. Shah, et al., "Distributed Storage Codes with Repair-by-Transfer and Non-achievability of Interior Points on the Storage-Bandwidth Tradeoff", IEEE Transactions on Information Theory, vol. 58, Issue 3, Mar. 2012, 30 pages.

N. Shah, et al., "A Flexible Class of Regenerating Codes for Distributed Storage", ISIT 2010, Austin, Texas, U.S.A., Jun. 13-18, 2010, 5 pages.

K. V. Rashmi, et al., "A Piggybacking Design Framework for Read- and Download-efficient Distributed Storage Codes", 2013 IEEE International Symposium on Information Theory Proceedings (ISIT), Jul. 7-12, 2013, 19 pages.

V. Guruswami, et al., "Repairing Reed-Solomon Codes", Aug. 10, 2016, arXiv:1509.04764v2 [cs.IT], 25 pages.

I. Dinur, et al., "Analytical Approach to Parallel Repetition", Jul. 8, 2014, arXiv:1305.1979v3 [cs.CC], 33 pages.

H. L. Alder, "Partition Identities—From Euler to the Present", The American Mathematical Monthly, vol. 76, No. 7, Aug.-Sep. 1969), 14 pages.

Y. Wu, et al., "Reducing Repair Traffic for Erasure Coding-Based Storage via Interference Alignment", ISIT 2009, Seoul, Korea, Jun. 28-Jul. 3, 2009, 5 pages.

M. Silberstein, et al., "Lazy Means Smart: Reducing Repair Bandwidth Costs in Erasure-coded Distributed Storage", SYSTOR 2014 Proceedings of International Conference on Systems and Storage, ACM, Jun. 2014, 7 pages.

K. V. Rashmi, et al., "A Solution to the Network Challenges of Data Recovery in Erasure-coded Distributed Storage Systems: A Study on the Facebook Warehouse Cluster", Presented as part of the 5th USENIX Workshop on Hot Topics in Storage and File Systems, arXiv:1309.0186v1 [cs.NI], Sep. 1, 2013, 5 pages.

Y. Hu, et al., "NCCloud: Applying Network Coding for the Storage Repair in a Cloud-of-Clouds", IEEE Transactions on Computers, vol. 63, Issue: 1, Jan. 2014, 8 pages.

J. Heide, et al., "On Code Parameters and Coding Vector Representation for Practical RLNC", 2011 IEEE International Conference on Communications (ICC), Jun. 5-9, 2011, 5 pages.

A. Khan, et al., "Improved bounds on the decoding failure probability of network coding over multi-source multi-relay networks", arXiv:1607.06143v1 [cs.IT], Jul. 20, 2016, IEEE Communications Letters, 4 pages.

B. Gaston, et al., "A realistic distributed storage system that minimizes data storage and repair bandwidth", arXiv:1301.1549v1 [cs.IT], Jan. 8, 2013, 10 pages.

S. Akhlaghi, et al., "A Fundamental Trade-off Between the Download Cost and Repair Bandwidth In Distributed Storage Systems", 2010 IEEE International Symposium on Network Coding (NetCod), Jun. 9-11, 2010, 6 pages.

J. Li, et al., "Tree-structured Data Regeneration in Distributed Storage Systems with Regenerating Codes", 2010 Proceedings IEEE INFOCOM, Mar. 14-19, 2010, 9 pages.

A. Dimakis, et al., "Network Coding for Distributed Storage Systems", arXiv:0803.0632v1 [cs.NI], Mar. 5, 2008, 12 pages.

Richard P. Stanley, "Enumerative Combinatorics", vol. 1, Second Edition, (version of Jul. 15, 2011), pp. 1-100.

Richard P. Stanley, "Enumerative Combinatorics", vol. 1, Second Edition, (version of Jul. 15, 2011), pp. 101-200.

Richard P. Stanley, "Enumerative Combinatorics", vol. 1, Second Edition, (version of Jul. 15, 2011), pp. 201-300.

Richard P. Stanley, "Enumerative Combinatorics", vol. 1, Second Edition, (version of Jul. 15, 2011), pp. 301-400.

Richard P. Stanley, "Enumerative Combinatorics", vol. 1, Second Edition, (version of Jul. 15, 2011), pp. 401-500.

Richard P. Stanley, "Enumerative Combinatorics", vol. 1, Second Edition, (version of Jul. 15, 2011), pp. 501-600.

Richard P. Stanley, "Enumerative Combinatorics", vol. 1, Second Edition, (version of Jul. 15, 2011), pp. 601-725.

* cited by examiner

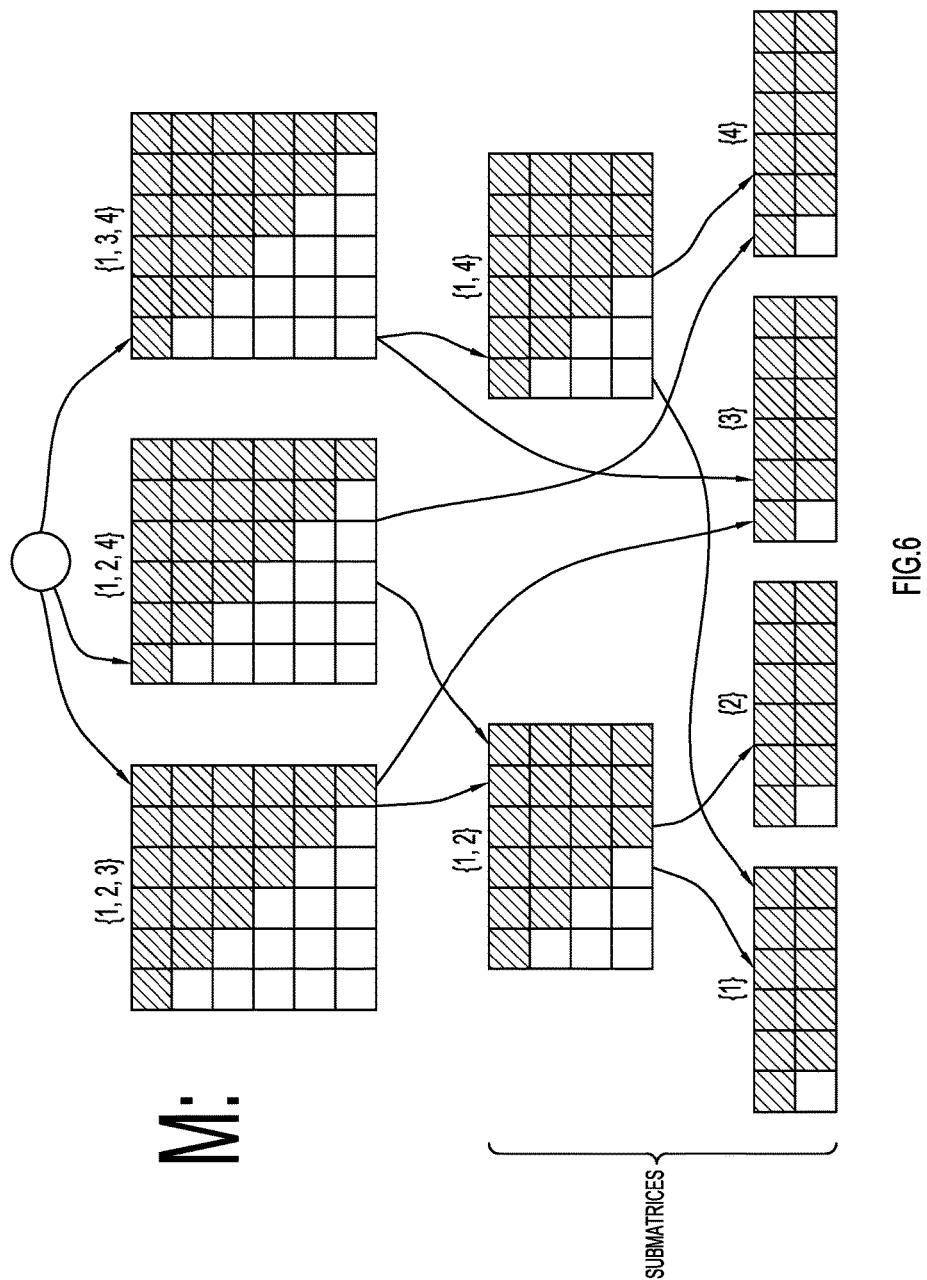

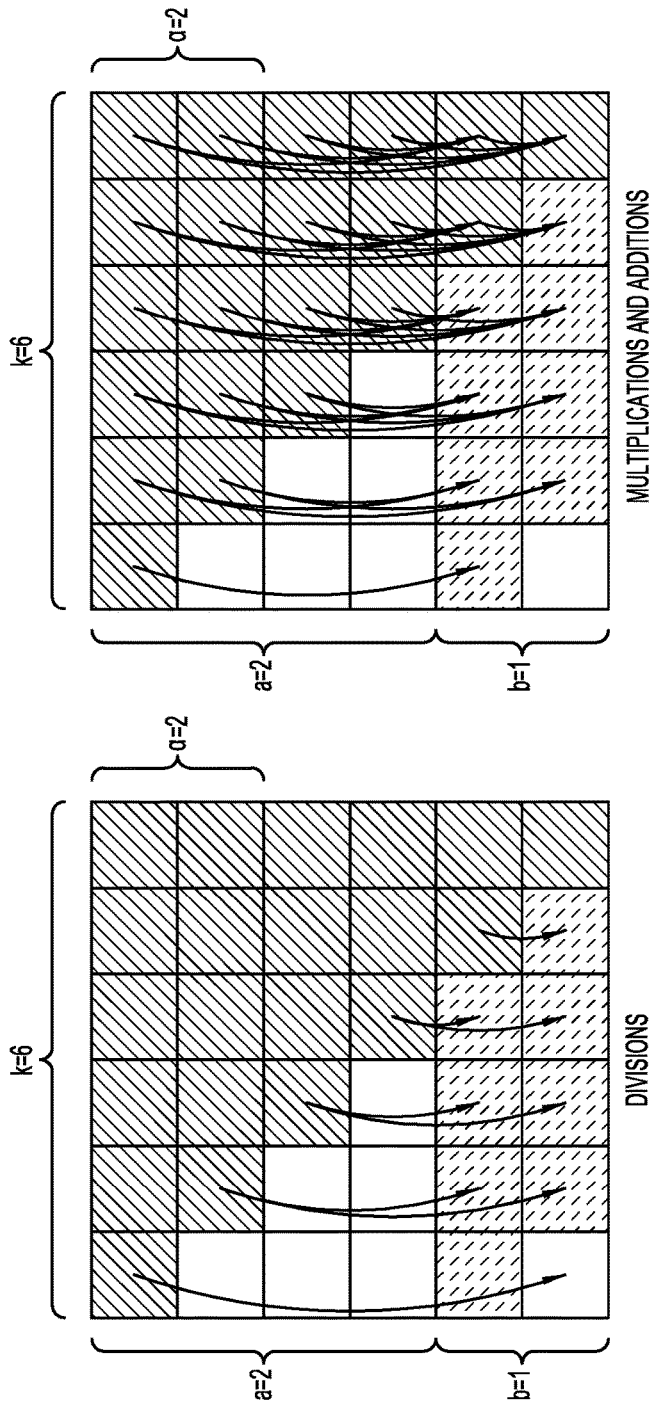

GRAPH G SHOWING COVERS
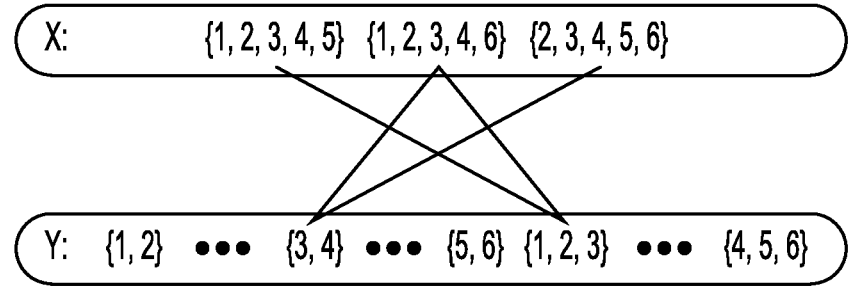
GRAPH G̃ SHOWING PARTIAL COVERS
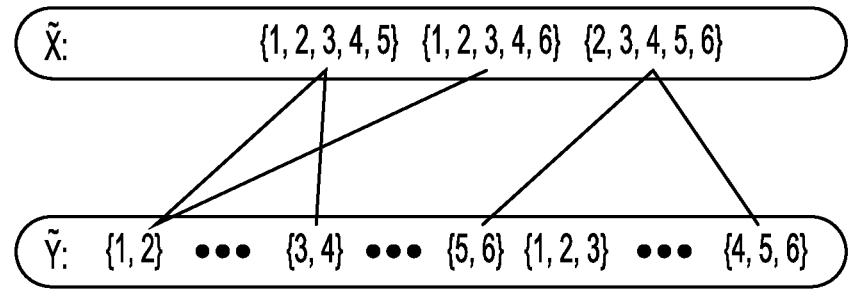
SETS OF SELECTED MATRICES
$S_2^{sel} : \left\{ \{4, 5\} ; \{4, 6\} \right\}$
$S_3^{sel} : \left\{ \{2, 3, 6\} ; \{1, 2, 6\} ; \{2, 5, 6\} \right\}$
FIG.11

EFFICIENT REPAIR OF ERASURE CODED DATA BASED ON COEFFICIENT MATRIX DECOMPOSITION

TECHNICAL FIELD

The present disclosure relates to efficient recovery of erasure coded data in distributed storage systems.

BACKGROUND

Erasure codes such as Random Linear Network Coding (RLNC) select coding coefficients randomly, and employ functional repair. These codes typically provide reasonable probabilistic guarantees that data can be recovered from distributed storage nodes if a certain number of storage nodes are unavailable. However, if such codes are to be employed in environments where even a small chance of data loss is unacceptable, a mechanism is needed to provide stronger guarantees for data survival. Such a mechanism should also eliminate delays in accessing data caused by a non-invertible encoding matrix. To guarantee that a repair maintains the property that data can be recovered even if L out of N of the storage nodes are unavailable, combinations of (N-L) out of N matrices should be checked for every single repair strategy. The most basic form of a checking mechanism involves calculating the rank of a part, or all, of potential decoding matrices. Each matrix check is an order of computation $O(n^3)$ operation. This is a computationally intensive process that puts a strain on the system and potentially delays the repair of lost data.

BRIEF DESCRIPTION OF THE DRAWINGS

FIG. 6 shows a valid decomposition of coefficient matrices to be rank checked, according to an example embodiment.

FIG. 9A is an illustration of required division operations for reducing a matrix to UTF using a merging operation, according to an example embodiment.

FIG. 9B is an illustration of required multiplication and addition operations for reducing a matrix to UTF using the merging operation, according to an example embodiment.

FIG. 11 is an illustration for a state of a divide and conquer algorithm used for a decomposition and that shows graphs and sets of already selected matrices used for the decomposition, according to an example embodiment.

DESCRIPTION OF EXAMPLE EMBODIMENTS

Overview

A controller device is configured to communicate with storage nodes of a distributed storage system in which erasure codes are used to encode source data onto the storage nodes and ranks of matrices containing coding coefficients associated with the erasure codes indicate whether repairs of failed storage nodes of the distributed storage system are feasible. A decomposition structure is generated to be used as a guide for transforming the matrices to upper triangle form (UTF) for use in computing the ranks of the matrices. The decomposition structure defines (i) a break-down of the matrices into submatrices each including a number of rows of coding coefficients less than the number of rows of coding coefficients in each of the matrices, and (ii) mappings among the matrices and the submatrices that indicate how to merge the submatrices in order to transform the matrices to UTF. While the distributed storage system performs repairs of the failed storage nodes, as part of determining feasible repair strategies for subsequent repairs of failed storage nodes, the ranks of the matrices are computed by transforming the matrices to UTF using operations on the submatrices according to the decomposition structure.

Example Embodiments

The description below is divided into the following three overlapping sections: DSS ENVIRONMENT; TREATISE; and COEFFICIENT MATRICES DECOMPOSITION AND USE. The DSS ENVIRONMENT presents a distributed storage system (DSS) environment in which embodiments presented herein may be implemented. The TREATISE presents a rigorous treatment of the embodiments, including theory, analysis, and low-level implementation details underpinning the embodiments. The COEFFICIENT MATRIX DECOMPOSITION AND USE THEREOF presents embodiments directed to generating a decomposition of coefficient matrices and checking their ranks using the decomposition, without revisiting the mathematical treatment presented in the TREATISE.

DSS Environment

Figure 1:
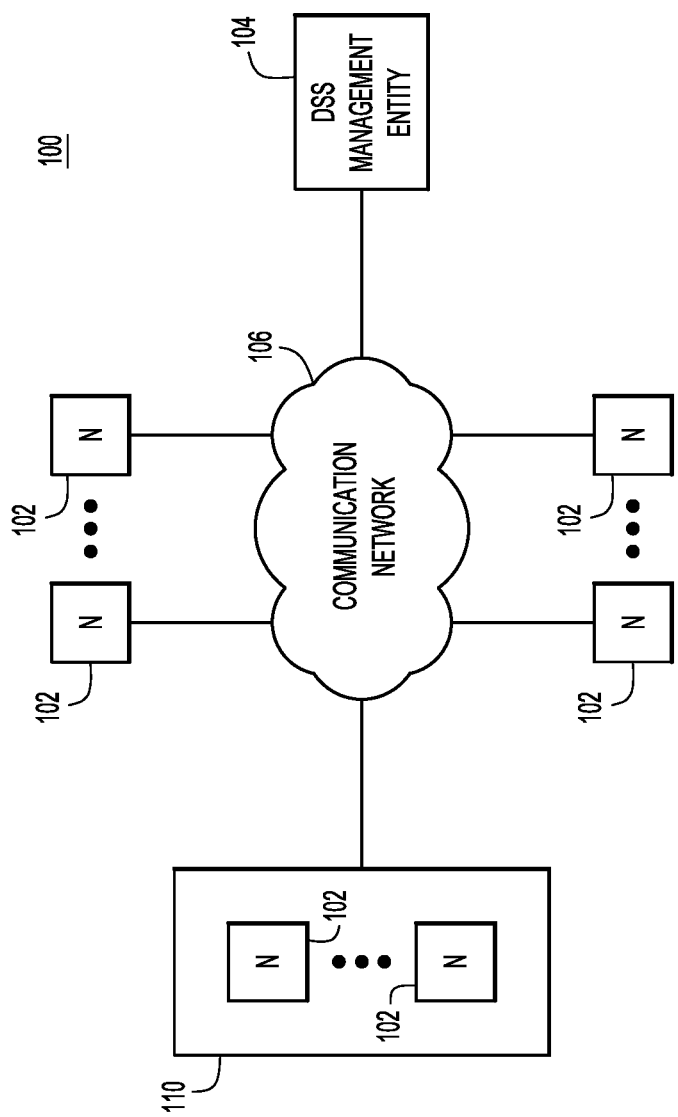
FIG. 1 is a distributed storage system (DSS) in which embodiments directed to coefficient matrix decomposition and uses thereof may be implemented, according to an example embodiment.

With reference to FIG. 1, there is shown a distributed storage system (DSS) 100 in which embodiments presented herein may be implemented. DSS 100 includes a large number of distributed data storage nodes 102 (referred to collectively as "nodes 102" and singularly as "a node 102") and a DSS management entity 104 all connected directly or indirectly to a communication network 106, which may include one or more wide area networks (WANs), such as the Internet, and one or more local area networks (LANs). Subsets of storage nodes 102 may be deployed in data centers, such as a data center 110. Management entity 104 may provide centralized control over nodes 102, to configure the nodes, store data to the nodes, retrieve data from the nodes, and repair failed nodes. Each storage node 102 typically includes a local controller (not shown in FIG. 1) that provides local control of that node, for example, to receive data to be stored on the node, store the data on the node, and retrieve data from the node responsive to requests for the stored data.

Data storage on nodes 102 of DSS 100 relies on "erasure encoding" to ensure data can be recovered in the event of node failures. Erasure coding comprises use of codes that exhibit a maximum distance separable (MDS) property to encode source data into different encoded fragments. Typically, generator matrices (also referred to as "coefficient matrices") containing rows of coding coefficients operate on the source data to encode the source data into the encoded fragments. In an example source data, e.g., a source data packet, may be encoded into n different encoded fragments, which are then stored across n of nodes 102. To do this, assuming the encoded fragments have the MDS property, k fragments may be used to reconstruct the source data packet in the event that (n−k) of the nodes on which the fragments are stored fail. This is referred to as (n, k) coding.

A newly-constructed fragment that preserves the MDS property is considered "feasible," while a fragment that does not retain the MDS property is considered "unfeasible." A feasible repair is one that constructs feasible fragments. Reconstructing a lost fragment is not only computationally intensive, but requires as a prerequisite identifying a set of possible reconstructions, and determining which are feasible. Feasible repairs for different failure scenarios may be determined prior to a node failure and/or after a node failure. This preliminary feasibility determination may be much more computationally intensive than the reconstruction itself. With respect to the coefficient matrices implicated in a repair, determining repair feasibility involves determining whether the coefficient matrices are invertible, as indicated by their ranks. Thus, the embodiments reduce the computationally complexity of checking/determining the ranks of the relevant coefficient matrices.

Figure 2:
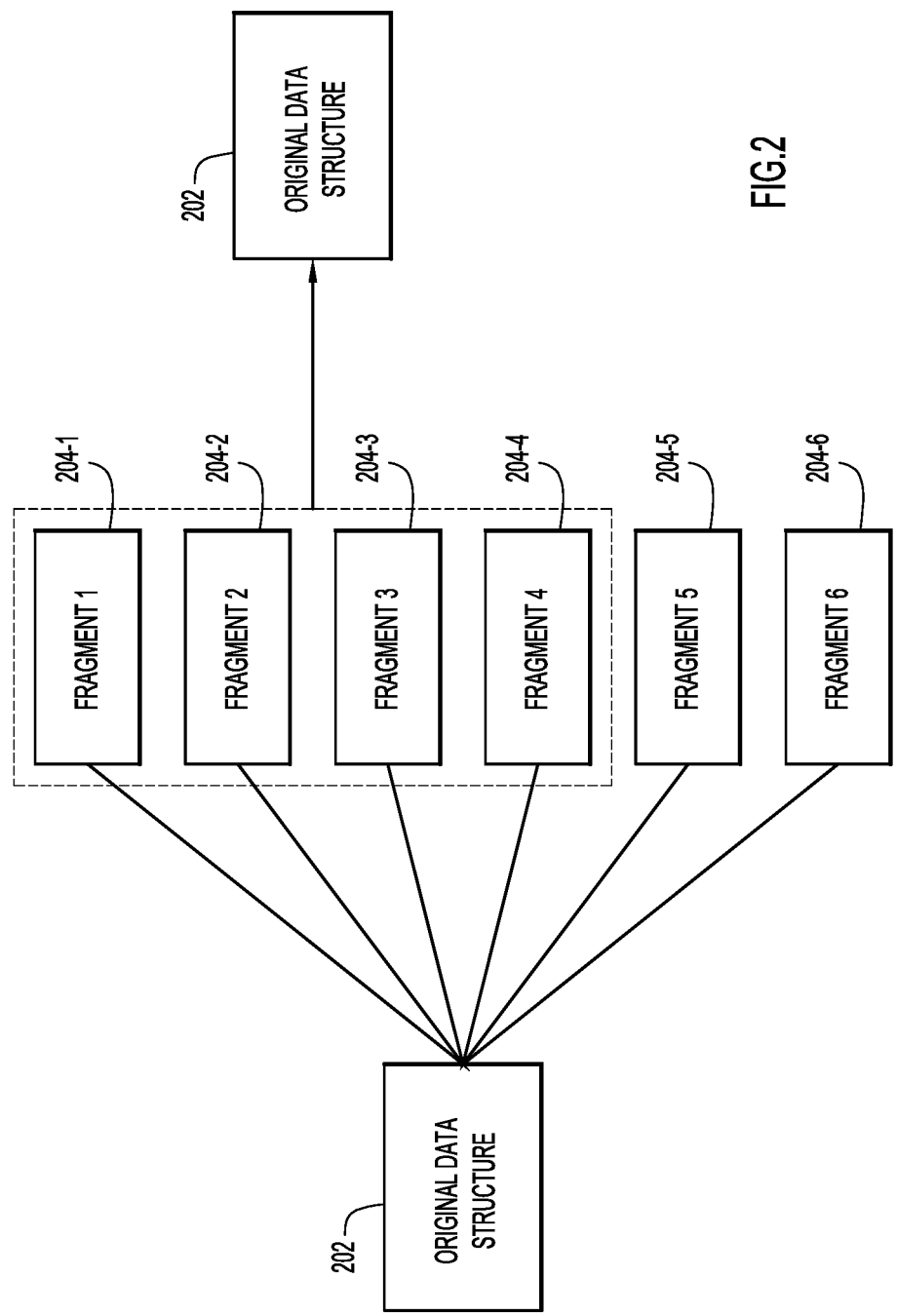
FIG. 2 is an illustration of data distribution for erasure coding in the DSS, according to an example embodiment.

With reference to FIG. 2 there is an illustration of an example data distribution for erasure coding or (n, k) encoding in DSS 100. An original data structure 202 (referred to as source data above) is mathematically transformed and divided into a plurality of n fragments 204. Provided the MDS property is preserved in the encoding and storage, original data structure 202 may be reconstructed from any k fragments (or "packets"). In the example of FIG. 2, n=6 and k=4. In other words, original data structure 202 is mathematically transformed and divided into fragments 204-1, 204-2, 204-3, 204-4, 204-5, and 204-6 each stored on a respective one of nodes 102 (not shown in FIG. 2). As illustrated, original data structure 202 can be reconstructed from, for example, fragments 204-1, 204-2, 204-3, and 204-4.

Figure 3:
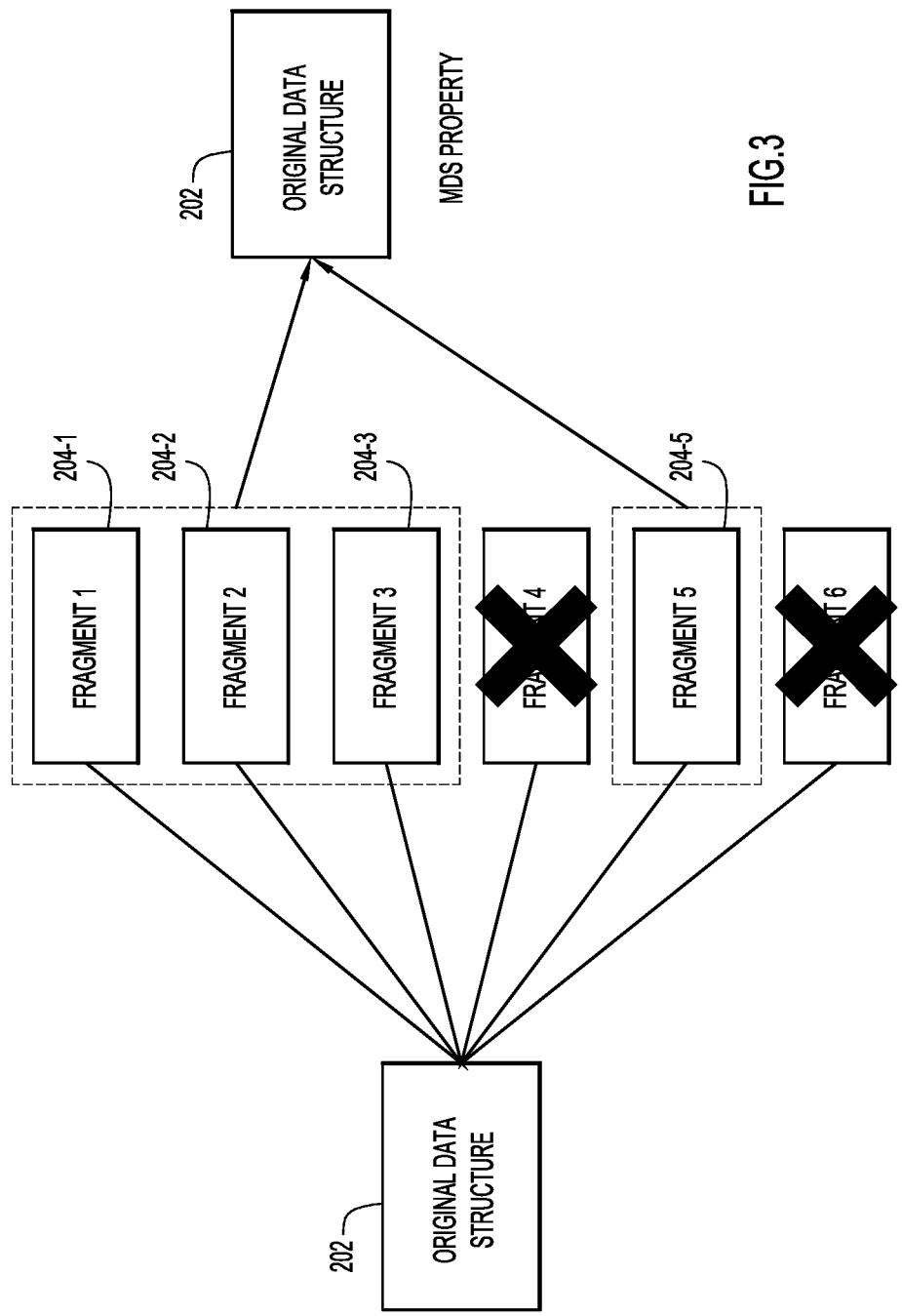
FIG. 3 is an illustration of the data distribution after it has experienced a loss of encoded data fragments due to node failures, according to an example embodiment.

With reference to FIG. 3, there is an illustration in which the data distribution of FIG. 2 has experienced a loss of fragments 204-4 and 204-6 due to node failures. The failures may be the result of a hardware failure, data corruption, or any other cause. As long as four nodes remain viable, original data structure 202 can be reconstructed.

Figure 4:
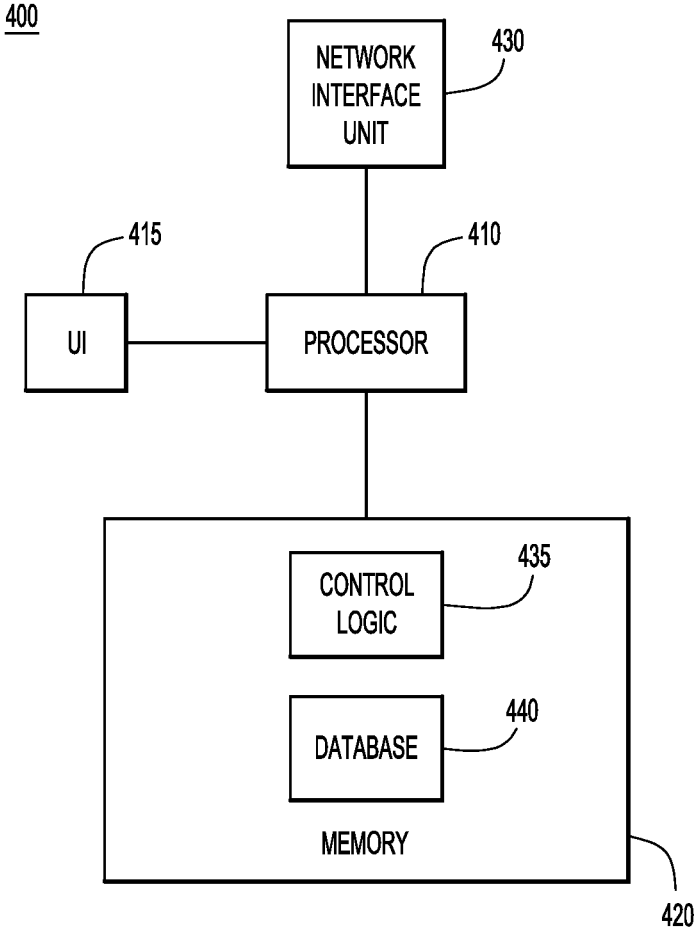
FIG. 4 is a block diagram of a generalized computer system/controller for implementing methods related to coefficient matrix decomposition and uses thereof, according to an example embodiment.

With reference to FIG. 4, there is depicted a block diagram of an example generalized computer system/controller 400 for DSS management entity 104, and for a controller in or local to each data storage node 102. Thus, computer system 400 is an example of compute, storage, and network resources for DSS management entity 104 or the corresponding node 102.

Computer system 400 includes a processor 410 that processes instructions to perform operations for DSS management entity 104 or the corresponding node 102; a memory 420 to store a variety of data and software instructions for execution by the processor 410; and user input/output (UI) devices 415, which may include, but are not limited to, a display, keyboard, mouse, microphone, speakers, and the like to present information to a user and permit the user to input information to the computer system. Computer system 400 also includes a network interface unit (e.g., network interface card or multiple network interface cards) 430 that enables network communications so that the computer system can communicate with other devices. Memory 420 may comprise read only memory (ROM), random access memory (RAM), magnetic disk storage media devices, optical storage media devices, flash memory devices, electrical, optical, or other physical/tangible (e.g., non-transitory) memory storage devices. The processor 410 is, for example, a microprocessor or microcontroller that executes instructions for implementing the processes described herein.

Figure 5A:
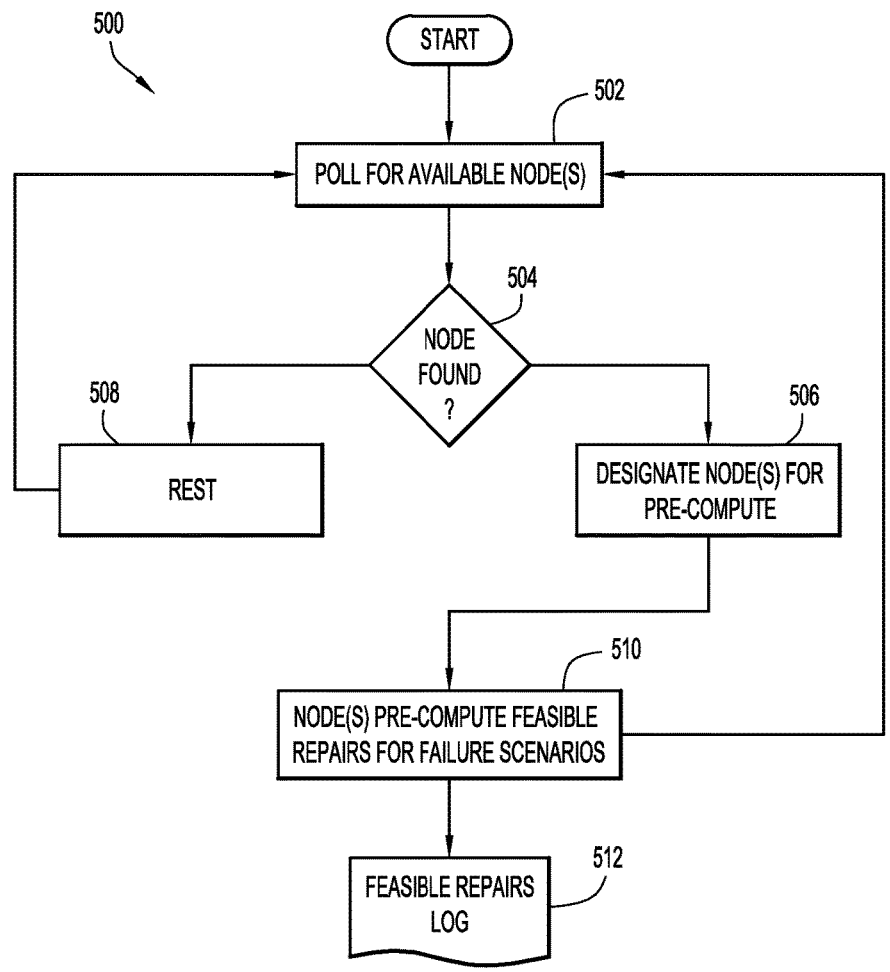
FIG. 5A is a flowchart of a high-level method of pre-computing feasible repairs in the DSS, according to an example embodiment.
Figure 5B:
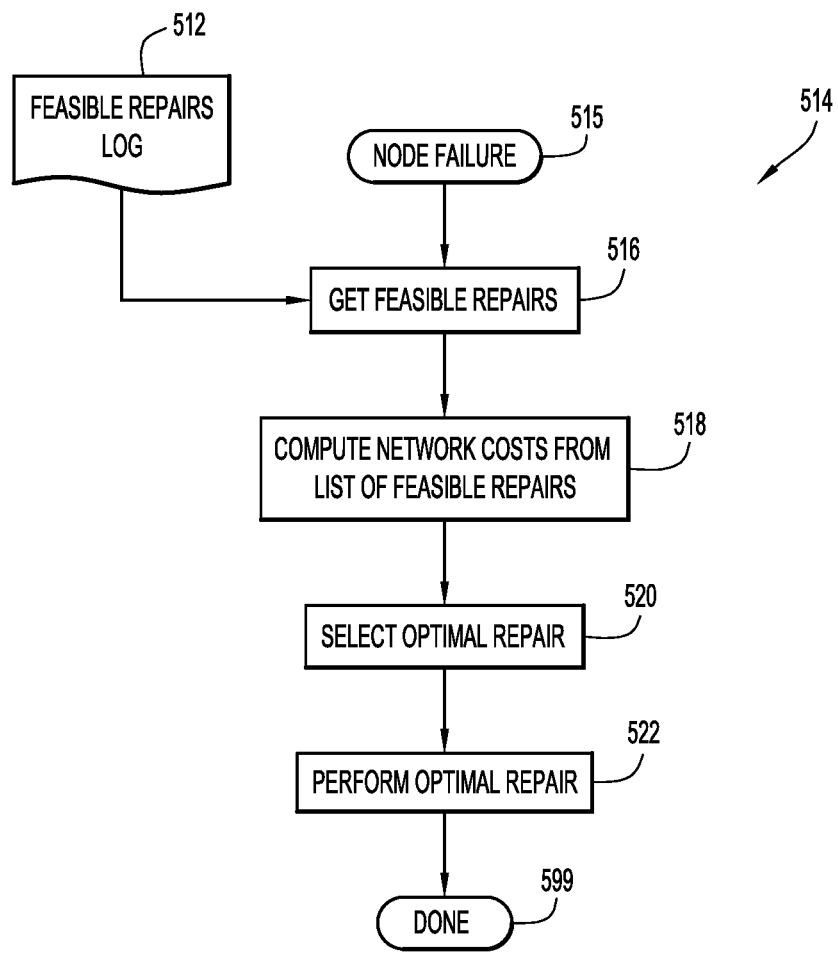
FIG. 5B is a flowchart of a method of effecting a repair upon failure of a node in the DSS, according to an example embodiment.

Thus, in general, the memory 420 may comprise one or more tangible (non-transitory) computer readable storage media (e.g., a memory device) encoded with software (e.g., control logic/software 435) comprising computer executable instructions and when the software is executed (by the processor 410) it is operable to perform the operations described herein. In DSS management entity 104, control logic 435 is configured to perform DSS management entity operations described herein. In a node 102, control logic 435 is configured to perform node operations described herein. In addition, memory 420 includes a data store or database 440 to store data used and generated by logic 435, including coefficient matrices, decompositions, source data, encoded data, and so on. In a node 102, memory 420 stores encoded data as described above. FIGS. 5A and 5B are flowcharts of an example two-stage method of performing network-aware storage repairs.

With reference to FIG. 5A, there is a flowchart of an example high-level method 500 of pre-computing feasible repairs in DSS 100. Method 500 may be performed proactively, before any of nodes 102 fail. The purpose of method 500 is to produce a feasible repairs log 512, which may include a table or list. For each possible failure scenario, one or more feasible repair options are given for that failure. Because the network state at the time of failure may not be known in advance, embodiments of feasible repair logs 512 do not include network cost analysis. That analysis may be performed before, or at the time of, a failure. Method 500 may be performed by one or more of nodes 102 and/or DSS management entity 104.

At 502, nodes 102 and DSS management entity 104 are polled to identify a controller (of one of the nodes or in DSS management entity 104) with compute bandwidth to perform all or part of a proactive feasible repair analysis. Alternatively, a dedicated controller may be used.

At 504, if no available node is found, the program rests at 508 for a given time, and then tries again. If a node is found, then at 506, the one or more nodes identified as available are designated for pre-computing the set of feasible repairs $\Xi_i$.

At 510, the one or more designated nodes perform their computations. The set of feasible repairs $\Xi_i$ is stored in feasible repairs log 512. In certain embodiments, a repair $\xi_i$ is only stored in feasible repair log if it is at least possible that $\xi_i$ can be an optimal repair. If it is determined (as described above) that $\xi_i$ cannot be the optimal repair, it may be excluded from the log. Embodiments directed to generating a decomposition of coefficient matrices and checking their ranks using the decomposition, described in detail below, may be implemented primarily at operation 510. Control then passes back to block 502, and updates to feasible repair log 512 are made as necessary.

With reference to FIG. 5B, there is a flowchart of an example method 514 of effecting a repair upon failure of a node. In this case, feasible repairs log 512 is an input to the process, and an objective is to determine which of the available repairs in optimal in light of current network conditions. The selected optimal repair is then carried out.

At 515, a node fails, creating the necessity of a repair.

At 516, a controller (e.g., of a node 102 or management entity 104) gets the list of feasible repairs for this failure event from feasible repairs log 512.

At 518, the controller computes a weighted network cost for each repair in the list of feasible repairs for this failure.

At 520, the controller selects the optimal repair, which may include weighting repairs according to their network costs, as discussed above.

At 522, the controller carries out the selected optimal repair, restoring the data to its desired level of redundancy.

In block 599, the method is done.

Treatise

I. Introduction

A. Erasure Coding for Distributed Storage

Erasure codes may be used in a distributed data system (DSS) having distributed storage nodes for storing encoded data. Erasure codes employing functional repair that select coding coefficients randomly, such as Random Linear Network Coding (RLNC), typically provide reasonable probabilistic guarantees that data can be recovered even if a certain number of storage nodes are unavailable. However, if such codes are to be employed in environments where even a small chance of data loss is unacceptable, a mechanism is needed to provide stronger guarantees for data survival. Such a mechanism also serves to eliminate delays in accessing data caused by a non-invertible encoding matrix. An efficient strategy to perform checks on repairs is presented herein. Concepts from dynamic programming are applied to greatly reduce the number of computations by decomposing matrix rank checks into smaller parts and memoizing partial results. Memoizing is the process of storing for later reuse. The memoized partial results can be reused both across checks for different repairs as well as across several generations of node failures.

To ensure that a system employing an erasure code with a Maximum Distance Separable (MDS) property maintains data recoverability if an arbitrary combination of L from the total of N nodes becomes unavailable, $\binom{N}{N-L}$ matrices must be checked to see that they are invertible. More generally, to include in the analysis erasure codes that are not MDS, each of these matrices must contain at least one submatrix of size n×n that is invertible, where n is the number of original source symbols. This is equivalent to checking that the rank of each matrix is n and can be performed efficiently by reducing the matrices to row echelon (upper triangular) form using Gaussian elimination and counting the number of all-zero rows. These checks should be performed before the initial distribution of data and again before every repair operation. Because they are computationally expensive, it is preferable to perform them in advance, before an actual node failure.

However, in such cases it is not known which node will fail, therefore $rN\binom{N}{N-L}$ matrices must be checked in advance if r repair strategies are considered for each possible node failure. Thus, when an actual failure occurs, the lowest cost repair can be selected based on up-to-date network state information. The goal of the presented techniques is to reduce the total number of operations over the lifetime of the system when performing these checks. This is critical in enabling network-aware repair operations by reducing the time between node failures when it is not known which repair strategy is best, reducing computational load on the distributed storage system and potentially enabling the checks to be performed on data distributions with a large number of storage nodes.

Herein is presented a technique that employs all of the above and focuses on providing efficient algorithms to decompose the Gaussian elimination into smaller parts and present an evaluation on its effectiveness. Some of the general properties of decompositions are formulated and it is shown how a decomposition can be employed to be the schema for the actual checks. The decompositions are critical in enabling the checks to be performed on data distributions with a large number of storage nodes and files split into many fragments. Use of the decomposition reduces the computational load on the system, decreases the time necessary to find a set of feasible repairs, and limits the probability that a potentially unchecked repair strategy is used or alternatively that the repair is delayed to wait for the checks to finish.

The decomposition leverages the fact that the matrices that need to be checked share many of their rows. Therefore, it is proposed to reuse submatrices after they have been reduced to an upper triangular form and memoized. Larger matrices can then be built by merging smaller matrices prepared in advance. Furthermore, many of these smaller matrices can also be reused in subsequent generations of failure and repair, further decreasing computational costs over the lifetime of the system. While techniques presented herein are motivated by the challenges posed by making RLNC usable in environments such as data centers, it is applicable for other erasure codes that employ functional repair. It can also be used to select feasible repairs in cases where the exact lower bound on the amount of data that needs to be transferred is not known.

B. Structure and Overview of Technical Contributions Presented in the Embodiments A first contribution is to make the repair of erasure-coded data network-aware by introducing a general framework that computes the feasibility of different possible repairs in advance. When a storage node fails, a repair is selected based on some cost function that reflects the current state of network connectivity among the storage nodes. By performing the potentially computationally-intensive feasibility checks in advance, the system is able to react to a node loss quickly and can base the repair selection on up-to-date network traffic data. Gains for different types of erasure codes are provided. The practical applicability of the proposed framework is also considered by presenting techniques to reduce the number of repairs to consider independent of the cost function in use. This aspect is especially important for RLNC, where the set of feasible repairs of potentially lowest cost is of exponential size when using a naive approach. A second contribution includes a technique to make checking the feasibility of a large number of repairs less computationally demanding. Two methods are presented to decompose the problem into smaller parts and formulate some of the general properties of decompositions. A technique is proposed to apply a decomposition as a schema for the actual checks as part of the proposed framework.

Section II, below, defines the concepts and related models formally and includes an algorithmic definition of a proposed network-aware repair framework and decomposition method. Section III examines different erasure codes and defines functions that determine the location of relevant, potentially minimal cost feasible repairs for each. Section IV looks at the cost of performing the feasibility checks and describes two algorithms to find good/effective decompositions. Section V provides experimental evidence showing the benefits of network-awareness and decompositions. Finally, Section VI summarizes findings.

II. System Model and Network-Aware Repair Framework

A. System Model

A file to be stored in the DSS is broken up into k pieces of identical size. Then, it is encoded using an erasure code to produce n coded pieces (packets). These are then distributed to the N nodes: $\Omega_n = (node_1\ node_2 \ldots node_N)$, with each storing exactly a. When $node_f$ fails, all packets it stored are considered lost and must be repaired onto a replacement node. The replacement node is designated with the same name and repairs are considered, where the surviving nodes can transfer different numbers $\beta_i$ of packets to $node_f$: $\xi = (\beta_1\ \beta_2 \ldots \beta_N)$. All possible repairs of code where $node_f$ was lost its repair space are called: $\Xi_f = \{\xi | 0 \leq a\ and\ \xi[i]=0\}$ and use the term generation to denote a round of loss and repair. The system is required to maintain its properties over an arbitrarily large number of generations. Only single node losses are considered as they are most common in systems with well-separated failure domains, however techniques presented herein may be used with multiple node losses. Performing concurrent repairs allows for techniques that can further reduce network usage. It is expected that the proposed framework will be useful in the case of multiple concurrent failures in reducing network costs. The effectiveness of RLNC and similar erasure codes is better if the storage nodes are able to perform some basic operations, mainly additions and multiplications, on the data during repairs. The models and evaluation herein study this case. Storage systems and codes with parameters that are N, n, k, $a \in \mathbb{N}^+$, $\beta_i \in \mathbb{N}$ are considered.

A repair is defined as feasible if the resulting system state maintains data recoverability after sustaining subsequent concurrent node losses. Each code, based on its parameters, therefore has a maximum number of L nodes it can lose concurrently while maintaining data recoverability. For codes employing exact repair like Reed-Solomon and RBT-MBR, the set of feasible repairs $\tilde{\Xi}_f$ as well as L is defined by the structure of the code. For regenerating codes employing functional repair, the set of feasible repairs is constrained by both the information flow graph and the coefficient selection method. On the information flow graph, a flow to a data collector with a value of at least K must be maintained with any L vertices from the final level of topological sorting removed from the graph. For codes using random coefficients such as RLNC, further checks are necessary to ensure that the selection of coefficients does not introduce linear dependence not portrayed on the information flow graph. In this sense, on an information flow graph with edges of capacity 1, i edge-disjoint paths must necessarily correspond to i linearly independent packets retrieved by the data collector. To ensure this condition is met when using randomly generated coefficients, Gaussian elimination can be used to check the rank of several coefficient matrices that correspond to data potentially retrieved by a data collector.

We denote the set of matrices that need to be checked with M and wish to define a mechanism that performs these checks in a computationally-efficient manner. The matrices contain the coefficients associated with data stored on N−L−1 surviving and one repaired node, a rows from each. Matrices that do not contain repaired rows need not be checked as they have been checked before the repair. Similarly, if the same node fails in successive generations, the checks can be skipped, since no new coefficients are introduced into the system. The following notation distinguishes between matrices containing rows from i nodes: $s_i = \{j | s_i$ contains rows from node$j\}$. For example $s_3 = \{1, 2, 3\}$ contains rows from $node_1$, $node_2$ and $node_3$. While this representation is easier to follow, an alternative representation using bitmaps should be considered when implementing the algorithms that find good decompositions. Every coefficient matrix of size ia×k can be represented with a bitmap (row vector with 0 and 1 elements) $s'_i$ of size N based on which nodes its rows originate from. $s'_i[j]=1$ if it contains rows of coefficients from node j and $s'_i[j]=0$ otherwise. For example, $s'_3=(0\ 0\ 0\ 1\ 1\ 1)$ contains data from $node_1$, $node_2$ and $node_3$. Thus, bitwise operations which have a low CPU cycle cost can be used instead of set operations. Furthermore, a bitmap fits into a single 32 bit or 64 bit variable as typically N<<64.

B. Representing the Cost of Network Transfers

We define the cost functions using matrix C, where $c_{i,j}$ denotes the cost to transfer a single packet from $node_1$ to $node_2$ and C[j] is column j that contains the costs associated with transfers to $node_j$. Two restrictions are introduced on C. First, the diagonal elements must be $c_{i,i}=0$. Second, all other elements i≠j, $c_{i,j} \geq 0$.

$$C \begin{pmatrix} 0 & c_{1,2} & \ldots & c_{1,N} \\ c_{2,1} & 0 & \ldots & c_{2,N} \\ \vdots & \vdots & \ddots & \vdots \\ c_{N,1} & c_{N,2} & \ldots & 0 \end{pmatrix}$$

We use this general way of modeling costs to make it applicable to different network topologies and traffic patterns. It can be based on any number of measured parameters such as available bandwidth, latencies, number of dropped packets, queueing delays, etc. It can be used, but is not limited, to minimize the total time required for repairing lost data. An assumption is made that the cost of transferring a single packet from $node_1$ to $node_j$ is not dependent on the total number of packets sent between them in the period in which the cost is regarded as accurate. This assumption is valid if the examined period is short or the repair traffic is a negligible fraction of the traffic flowing on the same links.

We evaluate the network-aware cost-weighted repair space of the code, where the weighted cost for repairing data on node$_f$ using repairs $\xi i$ is $cost(\xi i) = \xi_i C[f]$, where $C[f]$ is used to denote column f.

C. A Network-Aware Repair Framework

The proposed framework selects the lowest cost repair that is independent of the erasure code and network topology, illustrated in Algorithm 4, shown below. Whenever there is a change in the layout of the data (the initial distribution of data and any subsequent repairs), the set of feasible repairs $\tilde{\Xi}_f$ is computed for each possible subsequent node failure. The implementation of the is_feasible( ) function from Algorithm 2, shown below, is determined by the erasure code in question and the definition of feasibility as discussed in subsection II-A. When a node fails, the cost for each feasible repair is calculated based on a cost function reflecting up-to-date network conditions.

The practical applicability of the proposed framework is determined by the complexity of the is_feasible( ) function, the size of $\Xi_f$ and $\tilde{\Xi}_f$. The former depends on how feasibility is defined. In the interpretation from Section II-A, the set of feasible repairs can be easily determined for codes employing exact repair. For codes that use functional repair and randomly selected coefficients, computational complexity is determined by the values of parameters N, n, k, a (defined in Table 1, below) as the rank of a potentially large number of matrices must be checked.

Algorithms 1 and 2, below, may be used to precompute feasibility in a network-aware repair framework.

Algorithm 1 Network-aware repair framework

```
1:      ⸗ Initial data distribution⸗
2:      precompute_feasibility
3:      min_cost := ∞
4:      repeat
5:          ⸗ node_f fails⸗
6:          for ξj ∈ Ξ_f do
7:              if cost(ξ_i) = ξ_i C[f] < min _cost then
8:                  min_cost := cost(ξ_i)
9:                  ξ_sel := ξ_i
10:             end if
11:         end for
12:         execute ξ_sel
13:         precompute_feasibility
14:     until false
```

Algorithm 2 Precompute feasiblity

```
1:      procedure precompute_fesibility
2:          Ξ̃_i := ∅
3:          for node_i ∈ Ω_N do
4:              for ξ_j ∈ Ξ_i do
5:                  if is_feasible(ξ_j) then
6:                      Ξ̃_i := Ξ̃_i ∪ ξ_j
7:                  end if
8:              end for
9:          end for
10:     end procedure
```

D. Decomposing Matrix Rank Checks into Reusable Parts

To perform the rank checks efficiently, embodiments include decomposing the Gaussian elimination performed for the coefficient matrices in M into smaller steps that can be shared between different checks and across subsequent failure and recovery generations. Once a set of steps and order is identified, it can be used as a schema as long as N, L and a do not change.

TABLE 1

Table of Notation

| | | |
|---|---|---|
| N | ≜ | the number of nodes |
| L | ≜ | the number of unavailable nodes the system must support while maintaining data availability |
| α | ≜ | the number of encoded symbols stored on a node, corresponding to rows in a coefficient matrix |
| r | ≜ | the number of repairs to check for a possible node failure |
| M | ≜ | the set of matrices that need to be checked |
| D | ≜ | the set of matrices that form a decomposition |
| ψ | ≜ | a mapping that defines how each matrix in D is broken down into two smaller matrices |
| $S_i$ | ≜ | the set of matrices of size ia × k in upper triangular form (UTF) |
| $S_i^{sel}$ | ≜ | the set of matrices of size ia × k selected in decomposition D |
| $s_i$ | ≜ | an arbitrary selected matrix from $S_i$ or $S_i^{sel}$ |
| $s_i^{(k)}$ | ≜ | the k-th matrix from $S_i$ or $S_i^{sel}$ given some aribitrarily defined order |
| lz(i) | ≜ | the number of leading zeros in $s_i \in S_i$ |
| d(a, b) | ≜ | the number of divisions needed to get $s_i = s_a \oplus s_b$ into UTF if both $s_a$ and $s_b$ are in UTF |
| m(a, b) | ≜ | the number of multiplications (same as the number of additions) needed to get $s_i = s_a \oplus s_b$ into UTF if both $s_a$ and $s_b$ are in UTF |
| $d_{Gauss}^{(k)}$ | ≜ | the number of divisions needed to get $s_k$ into UTF using Gaussian elimination |
| $m_{Gauss}^{(k)}$ | ≜ | the number of multiplications/additions needed to get $s_k$ into UTF using Gaussian elimination |

Definition 1. A decomposition(D, Ψ) is a set of matrices $D = \{s_1^{(1)}, s_1^{(2)}, \ldots, s_1^{(k_1)}, s_j^{(k_j)}\}$, where $s_i$ is composed of rows from i node, $j \leq N-L$, $k_j \leq \binom{N}{j}$, $M \subset D$ and a mapping to Ψ to match each matrix in D except those containing rows from a single node to a pair of matrices from D.

A decomposition can also be thought of as a directed acyclic graph that defines the dependencies between matrices as shown on FIG. 6, which shows an example of a valid decomposition D of coefficient matrices M to be rank checked. The matrices in D are the vertices of the graph and a root element is added that connects to all nodes representing $M \subset D$. Edges go between nodes according to Ψ to denote which pair of matrices should be transformed to upper triangular form before tackling a given matrix. The checks are then a traversal of the graph, and each visited vertex (matrix) is memoized in upper triangular form to reduce the number of operations in subsequent visits. The fewer matrices that need to be visited and the lower the cost of each visit, the fewer overall computations are necessary. Memory requirements only depend on the number of matrices.

With reference to the example of FIG. 6, each matrix in decomposition D is defined by the nodes with which the matrix is associated (i.e., the nodes that store data encoded by the rows of the matrix). For example, nodes {1,2,3} store data encoded with the rows of the top left-hand matrix identified {1,2,3}. The decomposition represents a breakdown of the three matrices M into relatively small matrices (also referred to herein as submatrices) {1,4}, {1,4}, {1}, {2}, {3}, and {4} each including a number of rows of coding coefficients less than the number of rows of coding coefficients in each of the matrices M (and each associated with a number of nodes less than a number of nodes associated with the matrices M), and (ii) mappings (indicated as downward pointing arrows/edges in FIG. 6) among the matrices and the submatrices that indicate how to merge the submatrices, once converted to UTF, so as to create the matrices in UTF, i.e., to merge the submatrices to transform the matrices to UTF.

Decomposition D also represents a matrix hierarchy in which the matrices M and the submatrices having successively increasing numbers of rows of coding coefficients (and which are associated with successively increasing numbers of nodes) are represented at successively increasing levels of the hierarchy, and the mappings indicate which submatrices represented at lower levels in the hierarchy are to be merged, in UTF, to create which submatrices and matrices represented at relatively higher levels in the hierarchy. For example, matrices M each have the most rows and occupy the highest level of the hierarchy, submatrices {1,2} and {1,4} each have incrementally fewer rows than each of the matrices M and occupy the middle level, and submatrices {1}, {2}, {3}, and {4} each have incrementally fewer rows still (the least amount of rows) and occupy the lowest level, which is the bottom of hierarchy.

The mappings include, for a given matrix/submatrix that is not at the bottom level of the hierarchy, two edges to lower level submatrices to be combined into the matrix/submatrix. Generally, one of the two edges identifies a submatrix on the lowest level while the other of the two edges identifies a submatrix one level down from the given matrix/submatrix. For example, matrix {1,2,3} has an edge leading to lowest level matrix {3} and an edge leading to one-level down intermediate matrix {1,2}.

Figure 7:
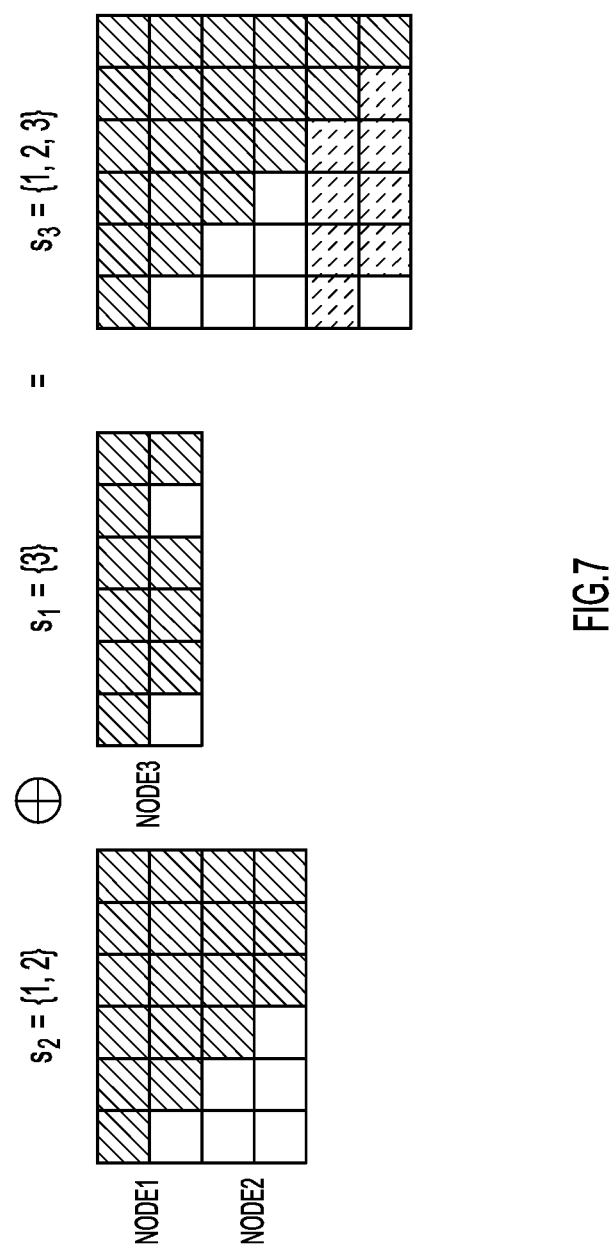
FIG. 7 is an illustration of a merging operation to merge two small matrices into one larger matrix when a decomposition is applied, according to an example embodiment.

Matrices of identical size are grouped to simplify the notation and use $S_i$ to denote the set of matrices of size is ia×k that includes all possible combinations of selecting all rows from i nodes. $S_i^{sel}=\{s_i|s_i \in s_i \cap D\}$ is the set of matrices that are selected to be part of D from $s_i$. This grouping determines the levels of the topological sorting of D. In order to traverse the graph, the merge operation $s_a \otimes s_b = s_i$, where a+b=i and $s_a \cap s_b = \emptyset$ is defined as follows. First, the rows of $s_b$ are appended to the end of $s_a$. Second, the rows of $s_a$ are used to create leading zeros in the appended rows to get the resulting $s_i$ matrix into Upper Triangular Form (UTF). FIG. 7 is an illustration of merging $s_2$ and $s_1$, a=2, with 0 elements shown as white boxes, non-zero elements shown with solid diagonal lines, and elements that are going to be transformed to 0s in the second step shown with a box fill in the form of dashed diagonal lines. The mapping $\Psi$ associates with each matrix $s_i \in S_i^{sel}$, i>1 a pair of matrices $s_a$ and $s_b$.

A valid decomposition D is one that can be used to recreate all matrices in M in upper triangular form using the merge operation. Furthermore, it must also provide a means to build all matrices in D except for matrices containing rows from a single node. For example, ={{1}; {2}; {3}; {4}; {1,2}; {1,4}; M}, shown on FIG. 6, is a valid decomposition for M={{1,2,3}, {1,3,4}}, but D'={{1}; {3}; {4}; {1,2}; {2,3}; M} (not pictured) is not, as neither {1,2}, {2,3} ∈ D' nor {1,3,4} ∈ M can be built from merging elements of D'. This example highlights that for a decomposition to be valid, it must contain all matrices that contain rows from a single node as well as intermediate matrices.

III. Locating Potentially Lowest-Cost Feasible Repairs

In this subsection specific cost functions for the different erasure codes are defined in order to reduce the number of repairs to consider and to be able to characterize the repair space of each code in terms of where the lowest cost feasible repairs are. The codes were chosen to cover both exact and functional repair and both MSR and MBR points on the storage—repair bandwidth trade-off curve.

Now, finding the minimum cost feasible repair $\xi_{min}$ and its associated cost is examined: $\kappa = \text{cost}(\xi_{min}) = \Sigma_{i=1, i \neq f}^{N} \beta_i C_{i,f}$ after losing the data stored on node$_f$.

A. Reed-Solomon

Decoding-based repair for Reed-Solomon (RS) is now examined as this can be applied to any linear MDS code. The evaluation is restricted to the a=1 case to be in line with how RS is generally used for storage. Let $c^{(1)}, c^{(2)}, \ldots, c^{(N-1)}$: $c^{(i)} \in \text{set}(C[f]) \backslash c_{f,f}$ be a permutation of costs in ascending order and $\beta^{(1)}, \beta^{(2)}, \ldots \beta^{(N-1)}$ the corresponding number of transferred packets. Thus, the cost of the minimal cost repair is shown on Equation (2) and the number of feasible repairs to consider given no knowledge of C is $|\tilde{\Xi}_f| = \binom{n}{k}$.

$$K_{RS} = \sum_{i=1}^{k} c^{(i)} \quad (2)$$

B. RBT-MBR

There are two distinct repair strategies to consider in the case of RBT-MBR. Ideally, each surviving node will transfer a single encoded packet ($\beta_i = 1$, i≠f) as defined in the code construction. Alternatively, if at least k distinct packets are transferred, the decoding of the embedded MDS code can take place and any missing code words can be re-encoded. Whilst this second repair strategy involves additional bandwidth and computation, it can result in lower transfer costs for some C. Let $c^{(i)}$ and $\beta^{(i)}$ be defined the same way as in the previous subsection. The cost of the optimal repair $\kappa_{RBT-MBR}$ is specified in Equation (3) based on the two repair strategies.

$$k_{RBT-MBR} = \min\left(\sum_{i=1}^{N-1} c^{(i)}, \sum_{i=1}^{N-L} (a-i+1)c^{(i)}\right) \quad (3)$$

The first term is the cost of transferring a single packet from each surviving node. The second term expresses retrieving as many packets from the lower cost nodes as possible without getting duplicates. $\Sigma_{i=1}^{N-L}(a-i+1)=k$ because the embedded code is MDS and the way RBT-MBR is constructed [5]. With no knowledge of C, the number of repairs that are potentially lowest cost is reduced to $|\tilde{\Xi}_f|=1+(N-L)!\binom{N-1}{N-L}$.

C. Network Coding

Unlike the previous codes, network coding does not have a fixed repair strategy, thus analyzing the information flow graph is resorted to limit the search for $\tilde{\Xi}_f$. During a repair, any L sized selection of nodes must transfer at least a packets for the system to be able to sustain the loss of L nodes following the repair as shown in Equation (4). This constraint is sufficient to ensure that the number of edge-disjoint paths on the information flow graph between the data source and a data collector does not decrease to below k if L nodes are subsequently lost. It is also necessary for codes at the MSR point. Let $\beta^{(1)}, \beta^{(2)}, \ldots, \beta^{(N-1)}$ be a permutation of packets transferred from remaining nodes of ascending order and $c^{(1)}, c^{(2)}, \ldots, c^{(N-1)}$ the respective costs from set(C[f])\c$_{f,f}$.

$$\sum_{i=1}^{L} \beta^{(i)} \geq \alpha \quad (4)$$

Taking equation (4) into consideration, a more specific cost function can be defined for the optimal repair in Equation (5) considering repairs $\Sigma_{i=1}^{N-1} \beta_i \leq k$.

$$k_{RLNC-MSR} = \sum_{i=1}^{L} c^{(i)} \beta^{(i)} + \sum_{i=L+1}^{N-1} c^{(i)} \beta^{(L)} = \quad (5)$$
$$= \sum_{i=1}^{L-1} c^{(i)} \beta^{(i)} + \beta^{(L)} \sum_{i=L}^{N-1} c^{(i)}$$

The first term expresses the cost for the L lowest values of $\beta^{(i)}$, the second term the cost for the rest of the nodes. Each of these must transfer at least $\beta^{(L)}$ to satisfy Equation (4). $\kappa_{RLNC-MSR}$ is minimized if the $c^{(i)}$ are in descending order, i.e. transferring more from cheaper nodes and less from expensive ones. The free variables are thus reduced to $\beta^{(1)}, \beta^{(2)}, \ldots \beta^{(L)}$. Given that Equation (4) should be satisfied with equality for this leads to a significant reduction in the number of potential repairs to consider shown in Equation (6). Furthermore, it determines the positions of the lowest cost feasible repairs in $\Xi_f$ and once C is known, the optimal repair can quickly be selected.

$$|\Xi_f| = \left| \left\{ \xi : \sum_{i=1}^{L} \beta^{(i)} = \alpha \right\} \right| \quad (6)$$

This is an integer partitioning problem on a that is constrained by limiting solutions to those with L additive parts. The number of non-constrained partitions is given by a recurrence formula based on Euler's pentagonal number theorem. The first elements can also be found in the On-Line Encyclopedia of Integer Sequences (OEIS) as sequence A000041. The number of solutions with L parts is equal to the number of partitions in which the largest part is of size L. A similar recurrence formula exists for this constrained version of the problem.

As the bound in Equation (4) is sufficient to ensure data survival for all parameters, the previous results may be applied for non-MSR codes as well. However, it is possible to define tighter bounds for these codes, shown on Equation (7).

$$\sum_{i=1}^{N-1} \beta^{(i)} \geq \gamma(\beta_{max}) \quad (7)$$

where $\gamma(\beta_{max}) = \max(\alpha - \beta_{max}, k \bmod \alpha) + \lceil k/\alpha \rceil$ It has been known to introduce a cap on the amount of packets any single node transfers, $1 \leq \beta_{max} \leq a$, and to argue against full flexibility ($\beta_{max} = a$), as it involves transferring at least k packets is actually the lowest cost repair strategy. Based on Equation (7), the costs of optimal repairs for a given $\beta_{max}$ are defined on Equation (8).

$$k_{RLNC}(\beta_{max}) = \quad (8)$$
$$\sum_{i=1}^{\lfloor \gamma(\beta_{max})/\beta_{max} \rfloor} c^i \beta_{max} + c^{(\lfloor \gamma(\beta_{max})/\beta_{max} \rfloor + 1)} (\gamma(\beta_{max}) \bmod \beta_{max})$$

A simple way to enumerate as many feasible repairs as possible using these bounds is to look at all values of $\beta_{max}$. The number of feasible repairs of potentially optimal cost is shown on Equation (9), giving a similar set of constrained integer problems as for the MSR point. In this case the constraint is that the largest part of a partition must be at most $\beta_{max}$. This is the same type of problem as for the MSR point, granted, on multiple values of $\beta_{max}$.

$$|\hat{\Xi}_f| \geq \sum_{\beta_{max}=1}^{a} \left| \left\{ \xi : \sum_{i=1}^{N-1} \beta^{(i)} = \gamma(\beta_{max}) \right\} \right| \quad (9)$$

1) Case study: Two sets of parameters at the MSR point for which RLNC behaves differently depending on C are now examined. These particular sets have been selected because of their low number of potentially minimum cost repairs. This keeps the illustration of the previously presented theoretical results brief. It is assumed with no loss in generality that the last node, $node_N$ failed and $c_1 = c_{1,N}$ are in ascending order.

A first case looks at look at k=12, a=6, N=4 and requires that L=2 failures be supported. Considering Equation (5) and assuming repairs do not introduce linear dependence, only 4 of them need to be compared to find $\xi_{min}$.

$\xi_1 = (3\ 3\ 3\ 0)$, $\xi_2 = (2\ 4\ 4\ 0)$, $\xi_3 = (1\ 5\ 5\ 0)$, $\xi_4 = (0\ 6\ 6\ 0)$

For $c_1 = c_2 + c_3$ all four repairs have the same cost. For $c_1 < c_2 + c_3$, $\xi_1$, the most balanced repair with the least amount of packets transferred, has the lowest cost. On the other hand, for $c_1 > c_2 + c_3$, $\text{cost}(\xi_1) > \text{cost}(\xi_2) > \text{cost}(\xi_3) > \text{cost}(\xi_4)$, i.e., the repair transferring the most amount of packets has the lowest cost. Thus, in these cases a traditional mechanism that only tries to minimize the amount of transferred data will sub-optimally pick $\xi_1$, giving an error of $\text{cost}(\xi_1) - \text{cost}(\xi_4) = c_1 - c_2 - c_3$. More importantly, $\xi_2$ and $\xi_3$ will not be the lowest cost repairs regardless of C, thus the number of relevant repairs whose feasibility must be checked is further reduced to just those transferring 9 and 12 packets, $\xi_1$ and $\xi_4$ in this case.

A second case looks at k=12, a=4, N=6 and requires that L=3 node failures be supported. In this case the lowest cost feasible repairs are:

$\xi_1 = (1\ 1\ 2\ 2\ 2\ 0)$, $\xi_2 = (0\ 2\ 2\ 2\ 2\ 0)$, $\xi_3 = (0\ 1\ 3\ 3\ 3\ 0)$, $\xi_4 = (0\ 0\ 4\ 4\ 4\ 0)$

The cut-off point between $\xi_1$ and $\xi_4$ is $c_1 + c_2 = 2(c_3 + c_4 + c_5)$. Due to the limited number of ways the number 4 can be reduced to additive components, there are no minimal cost feasible repairs with a total of 9 or 11 transferred linear combinations. Thus, there might not be a clear decreasing or increasing order of costs like in the previous example. Therefore, more repairs must be checked.

IV. An Efficient Method to Check the Feasibility of Repairs

Now, the checks required to ensure the feasibility of repairs for RLNC are studied. Since a naive approach involving Gaussian elimination that checks the rank of individual matrices one by one is computationally expensive, decomposing the process into reusable steps is proposed.

A. Characterizing the Costs Associated with the Checks

It is preferable to use decompositions that result in a small number of computations and matrices to memoize. Unfortunately, the number of valid decompositions is large and with increasing N, a combinatorial explosion is quickly reached. This section focuses on deriving the computational and storage costs associated with a decomposition and motivates the choice of algorithms for selecting effective decompositions.

Figure 8B:
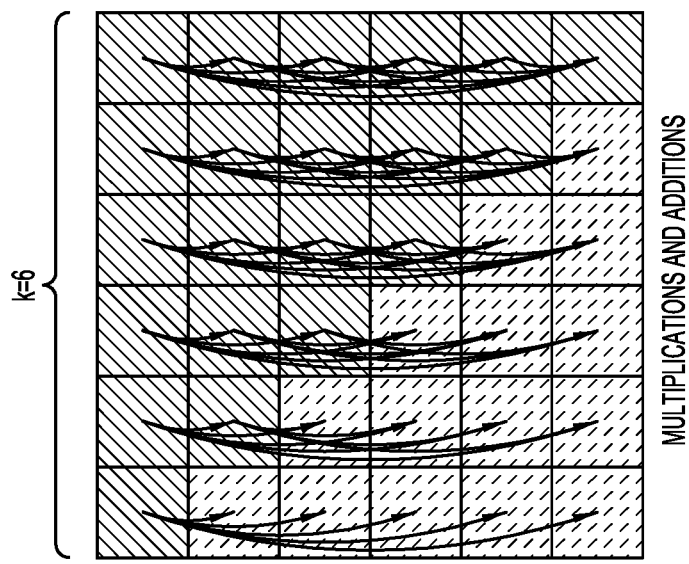
FIG. 8B is an illustration of required multiplication and addition operations for reducing a matrix to UTF using Gaussian elimination, while performing a rank check, according to an example embodiment.
Figure 8A:
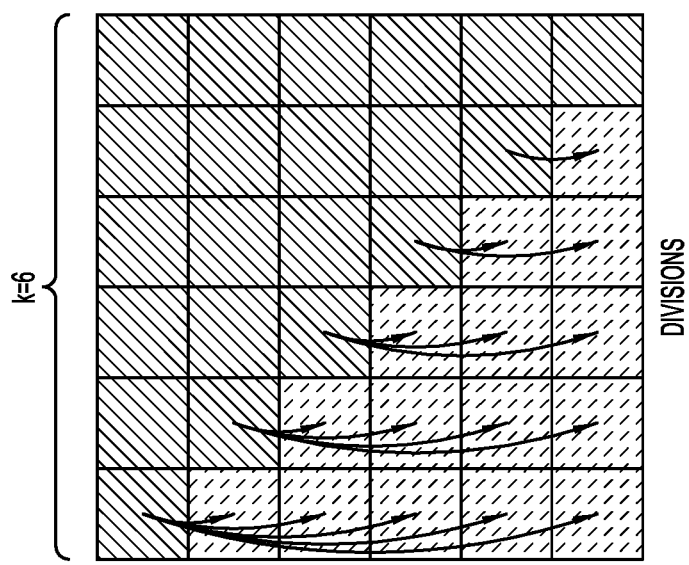
FIG. 8A is an illustration of required division operations for reducing a matrix to upper triangular form (UTF) using Gaussian elimination, while performing a rank check, according to an example embodiment.

The cost of reaching upper triangular form using basic Gaussian elimination:

First, the cost of reaching a UTF in a k×k matrix using Gaussian elimination is examined. This will act as a baseline for evaluating the proposed solution. Divisions and pairs of multiplications and additions are examined, with an example shown in FIGS. 8A and 8B for k=6, where FIG. 8A (divisions) and FIG. 8B (multiplications and additions) are illustrations that show required operations for reducing a matrix (k=6) to upper triangular form using Gaussian elimination. For a=2, this example corresponds to checking the coefficients associated with data stored on 3 nodes.

Several simplifications can be made to the general Gaussian elimination algorithm to save on computational cost: the back substitution step can be skipped and it is not necessary to reduce pivot elements to 1 (reduced row echelon form). Furthermore, all operations can be performed solely on the coefficient matrices.

The number of divisions:

$$d_{Gauss}(k) = \sum_{j=1}^{k-1}(k-j)(k-j+1) = \frac{k(k^2-1)}{3} \quad (10)$$

The number of multiplications, which is the same as the number of additions:

$$m_{Gauss}(k) = \sum_{j=1}^{k-1}(k-j)(k-j+1) = \frac{k(k^2-1)}{3} \quad (11)$$

The cost of merging $s_a \otimes s_b = s_i$:

Second, the computational cost of getting the result of merging UTF matrices of size a×k and b×k into a UTF, where a+b=i and i≥2. This includes the practically important case where a=b=i/2.

The number of 0 elements in an UTF matrix of size i×k gives a good indication on the amount operations that can be skipped when performing a merge:

$$lz(s_i) = lz(S_i) = lz(i) = \sum_{j=0}^{i\alpha-1} j = \frac{(i\alpha-1)i\alpha}{2} \quad (12)$$

The number of divisions is the number of elements that remain to be reduced to 0. The expression can be slightly simplified as shown in Equation (13).

$$d(a,b) = lz(i) - lz(i) - lz(a) - lz(b) = \sum_{j=1}^{b\alpha} a\alpha = ab\alpha^2 \quad (13)$$

With reference to FIG. 9A, there is shown an example for a=2, b=1, a=2, k=6, i.e., FIG. 9A shows required division operations for reducing a matrix (k=6) to upper triangular form using merging (with a=2, b=1, a=2). The arrows start from the elements that need to be divided to create a leading 0 at the location they point to. The number of multiplications is the same as the number of additions required for eliminating elements and is derived in Equation (14). FIG. 9B shows an example for a=2, b=1, a=2, k=6, i.e., FIG. 9B shows required multiplications and additions operations for reducing a matrix (k=6) to upper triangular form using merging (with a=2, b=1, a=2). The arrows start from the elements that are multiplied with a constant and then added to the location they point to. By comparing FIGS. 8A, 8B and 9A, 9B it is observed that intuitively, not having to eliminate the same elements multiple times (white boxes) is important for the effectiveness of the proposed technique compared to basic Gaussian elimination.

$$m(a,b) = \sum_{j=1}^{b\alpha} \sum_{l=j-1}^{a\alpha+j-2}(k-l) \quad (14)$$

$$= \sum_{j=1}^{b\alpha}\sum_{l=j-1}^{a\alpha+j-2} k - \sum_{j=1}^{b\alpha}\sum_{l=j-1}^{a\alpha+j-2} l$$

$$= \sum_{j=1}^{b\alpha} k(a\alpha + j - 2 - j + 1 + 1) -$$

$$\frac{1}{2}\sum_{j=1}^{b\alpha}[(a\alpha + j - 2)(a\alpha + j - 1) - (j-2)(j-1)]$$

$$= ab\alpha^2 k - \frac{1}{2}\sum_{j=1}^{b\alpha}(a^2\alpha^2 + 2a\alpha j - 3a\alpha)$$

$$= ab\alpha^2 k - \frac{b\alpha}{2}(a^2\alpha^2 + 3a\alpha) - \frac{2a\alpha}{2}\sum_{j=1}^{b\alpha} j$$

$$= ab\alpha^2 k - \frac{\alpha^2}{2}(a^2 b\alpha - 2ab + ab^2\alpha)$$

$$= ab\alpha^2 \left[k - \frac{1}{2}(a\alpha - 2 + b\alpha)\right]$$

$$= ab\alpha^2 \left(k - \frac{(a+b)\alpha}{2} + 1\right)$$

The Computational Cost of Decompositions:

Having looked at the cost of individual merges, this analysis returns to the total computational cost of a decomposition that checks a single repair for each node failure: the number of divisions in Equation (15) and the number of multiplications/additions in Equation (16).

$$DIV\ S(D) = \sum_{i=2}^{N-L}\sum_{s_i \in S_i^{sel}} d(a,b) + \sum_{s_i \in S_1} lz(1) \quad (15)$$

$$= \sum_{i=2}^{N-L}\sum_{s_i \in S_i^{sel}} d(a,b) + N\frac{\alpha^2 - \alpha}{2}$$

-continued $$MA(D) = \sum_{i=2}^{N-L} \sum_{s_i \in S_i^{sel}} m(a, b) + \sum_{s_i \in S_1} \sum_{j=1}^{a} (k - j + 1) \quad (16)$$

The second term in both equations is the cost of transforming matrices $s_i \in S_1$, including the r sets of repaired rows for each of the possible node failures into upper triangular form. If matrices from previous generations are stored, then the summation can simply skip these. If a decomposition avoids memoizing matrices containing repaired rows, the value of r only influences the number of computations by determining the size of $S_1$ and $S_{N-L}$.

$$|S_1| = N(r + 1) \quad (17)$$

$$|S_{N-L}| = N\binom{N-1}{N-L-1}r$$

The number of reusable matrices depends non-trivially on the decomposition.

The Memory Requirements of Decompositions:

The proposed approach requires memory to store memoized matrices. The number of matrix elements that need to be stored for decomposition D is given in Equation (18).

$$MEMO_{naive}(D) = \sum_{i=1}^{N-L} |S_i^{sel}| i\alpha k \quad (18)$$

A simple improvement can be achieved by only storing non-zero elements. This decreases storage costs to those given in Equation (19).

$$MEMO_{reduced}(D) = \sum_{i=1}^{N-L} |S_i^{sel}|(i\alpha k - lz(i)) \quad (19)$$

B. Finding Efficient Decompositions

Observations on the Relationships Between Costs:

Based on the Equations (13) and (14), some observations can be made that will help in determining good decomposition strategies. Let a, b, a', b', c, d, $\in \mathbb{N}^+$, $s_b \in S_b$, $s_c \in S_c$, $s_d \in s_d$ and a+b+a'+b'+i and c+d=b.

1) m(a, b)=m(b, a) and d(a, b)=d(b, a) (because a and b are interchangeable in Equations (13), (14))
2) d(a, b)>d(a', b')⇔|a−b|<|a'−b'| (consequence of Equation (13) and because more imbalanced sets have a larger number of already reduced elements; the larger the matrix, the more reduced elements it has)
3) m(a, b)>m(a', b')⇔|a−b|<|a'−b'| (consequence of Equation (14) in which the part in brackets is the same for a, b and a', b')
4) m(a, b)>m(a', b')⇔d(a, b)>d(a', b') (same argument as previous observation)
5) $lz(s_b) > lz(s_c) + lz(s_d)$ (consequence of Equation (12) and $i^2 > a^2 + b^2$)
6) d(a, b)≤d(a, c)+d(a+c, d) (consequence of previous observation and Equation (13))

Observation 4) is important because a decomposition that minimizes the number of divisions will also minimize the number of multiplications and additions. Observation 2) and 3) have the consequence that a decomposition that decreases i by one (i.e. selecting=1, b=i−1 or b=1, a=i−1) has the lowest computational cost in that decomposition step. This method is referred to as decrease and conquer. Conversely, $$a = \left\lfloor \frac{i}{2} \right\rfloor \text{ or } b = \left\lfloor \frac{i}{2} \right\rfloor$$

has the highest number of computations for any given i. On the other hand, it also reduces the size of the matrix by the greatest degree. Thus matrices between $s_{[i/2]}$ and $S_i$ can be skipped and less space is needed. This approach is referred to as divide and conquer and propose the following method to deal with odd levels: if i is even, divide the problem into $$a = b = \frac{i}{2}.$$

If i is odd, fall back to the previous approach and decrease the problem to a=a−1, b=1. An alternative decrease and conquer decomposition would be to select $$a = \left\lceil \frac{i}{2} \right\rceil \text{ and } b = \left\lfloor \frac{i}{2} \right\rfloor,$$

then do a second decomposition if a≠b to cover $S_b$ using $S_a$ and $S_1$.

There is therefore a trade-off between minimizing the number of levels (and reducing memory requirements in the process) in a decomposition and the cost of moving between levels using merging. However, it is not immediately apparent how the number of matrices in each level ($|S_i^{sel}|$) changes for different points on the trade-off curve. This metric also plays a key role in determining the number of computations. The following subsections propose two heuristic-based algorithms to find decompositions for both the decrease and conquer and divide and conquer methods.

The First Step of a Decomposition:

As described in Section II, matrices containing rows from N−L−1 existing nodes and one hypothetically repaired node must be checked. Considering that r hypothetical repairs are checked for each possible node failure, $|M|=(L+1)r\binom{N}{N-L-1}$. Instead of starting from these matrices, the first step of a decomposition should be treated differently to ensure that no repaired rows are present in any matrix in $S_{N-L-1}$. This is because it is not known which node will fail at the time of the checks and hypothetical repaired rows severely limit the reusability of matrices.

To account for this, a simple schema to determine the first step of the decomposition is proposed. The matrices in $S_{N-L}$ can be built in the following way: by selecting $S_{N-L-1}^{sel} = S_{N-L-1}$ (i.e. taking all possible matrices that contain N−L−1 non-repaired rows) and adding every possible repaired row to each of them, $S_{N-L}$. This allows the decomposition to start from $M = S_{N-L-1}$ instead of $S_{N-L}$ and only include coefficients from existing rows to maximize matrix reuse. Section IV-B3 shows that this first step is optimal in selecting the minimal number of matrices from $S_{N-L-1}$.

As discussed below, Algorithm 3 may be used as a greedy algorithm for decrease and conquer.

| Algorithm 3 Greedy algorithm for decrease and conquer |
| --- |
| 1: build G(i, 1) |
| 2: while X ≠ ∅ do |
| 3:    find $v_y$, where $deg(v_y) \geq deg(v_{y_j}], \forall v_i \in G$ |
| 4:    $S_{i-1}^{sel} = S_{i-1}^{sel} \cup v_y$ |
| 5:    Y = Y \ $v_y$ |
| 6:    for all $v_x$, where $(v_x, v_y) \in E(G)$ do |
| 7:      X = X \ $v_x$ |
| 8:      $E(G) = E(G) \setminus (v_x, v^*)$ ▷ all edges involving $v_x$ |
| 9:    end for |
| 10: end while |
| 11: return $S_{i-1}^{sel}$ |

Greedy Algorithm for Decrease and Conquer:

We wish to select $S_{s-1}$ in such a way that all elements of $S_i^{sel}$ can be generated by adding an element of $S_1$ to an element of $S_{i-1}$. Let G=(V, E) be an undirected bipartite graph with vertices divided into sets V=X ∪ Y, where X={$s_i | s_i \in S_i^{sel}$} and Y={$s_{i-1} | s_{i-1} \in S_{i-1}^{all\ combos}$}. There is an edge between a vertex $v_x \in X$ and $v_y \in Y$ if and only if for the corresponding $s_i$ and $s_{i-1}$, $s_{i-1} \subset s_i$. It is desired to cover all vertices $v_x \in X$ using as few vertices $v_y \in Y$ as possible. At each step in the algorithm, the vertex $v_y$ with the highest degree is selected and removed from the graph. All vertices $v_x$ it is connected to are also removed along with any edges containing $v_x$. The algorithm terminates when there are no more vertices in X.

The greedy algorithm is analogous to the approach of selecting a covering set in such a way that at every choice, the set that covers the most uncovered elements is selected. This is a H(n)-approximation algorithm and it has been proven that no polynomial-time algorithm with a better approximation factor exists for this NP-hard problem. Fortunately, n=max|$s_i$|=i, as all matrices from the set used for the cover have exactly i elements. Thus, even though |$S_i$|= ($_i^k$) increases computation costs quickly, the approximation factor increases slowly $$\left( \frac{\log i}{\log(i-1)} \right)$$

with i and remains acceptable even for large values of i.

Figure 10:
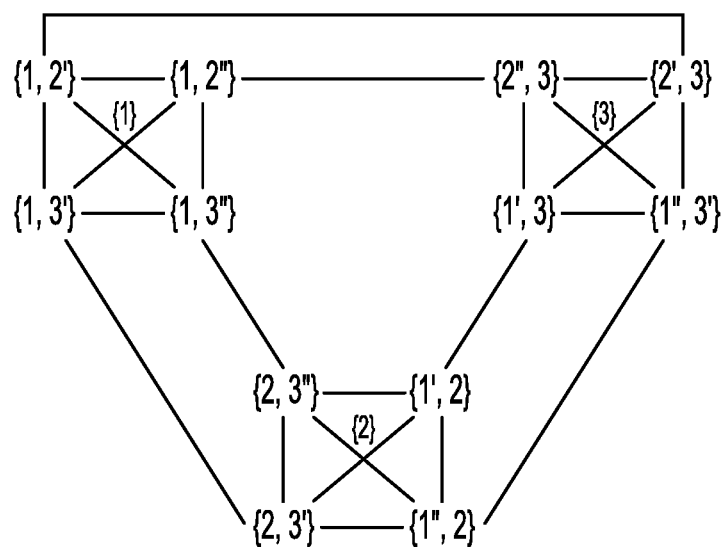
FIG. 10 is an illustration of shared rows of matrices that are to be rank checked, according to an example embodiment.

We could apply this algorithm for the first step of finding a decomposition and it would select a covering set that is the combination of N−L−1 out of N rows, as shown for example in FIG. 10, which is an illustration of shared rows of matrices in M that should be checked for N=2, L=1, r=2. Single and double apostrophes denote rows with coefficients from potential repairs. For example, 2' and 2' are rows resulting from the two different potential repairs of node$_2$.

Proposition 1. If r repairs are checked for each possible node failure, then |$S_{N-L}$|=|$S_{N-L}$−1|(L+1)r, which is the same as the previously proposed first step.

As discussed below, Algorithm 4 is a greedy algorithm for divide and conquer.

| Algorithm 4 Greedy algorithm for divide and conquer |
| --- |
| 1: Build G(a, b), G̃(a, b) |
| 2: while X ≠ ∅ do |
| 3:    MAX = {$v_y | v_y \in G, deg(v_y) \geq deg(v_{y_j}), \forall v_j \in G$} |
| 4:    find $\tilde{v}_y \in$ MAX, where $deg(\tilde{v}_y) \geq deg(\tilde{v}_j), \forall v_j \in G$ |
| 5:    if |$v_y$| = a then |
| 6:      $S_a^{sel} = S_a^{sel} \cup v_y$ |

| Algorithm 4 Greedy algorithm for divide and conquer |
| --- |
| 7:    else |
| 8:      $S_b^{sel} = S_b^{sel} \cup v_y$ |
| 9:    end if |
| 10:    Y = Y \ $v_y$ |
| 11:    $\tilde{Y} = \tilde{Y} \setminus \tilde{v}_y$ |
| 12:    $E(G) = E(G) \setminus (v^*, v_y)$ ▷ all edges involving $v_y$ |
| 13:    $E(\tilde{G}) = E(\tilde{G}) \setminus (\tilde{v}^*, \tilde{v}_y)$ ▷ all edges involving $\tilde{v}_y$ |
| 14:    for all $v_x$ covered by $v_y$ do |
| 15:      X = X \ $v_x$ |
| 16:      $\tilde{X} = \tilde{X} \setminus \tilde{v}_x$ |
| 17:      $E(G) = E(G) \setminus (v_x, v^*)$ ▷ all edges involving $v_x$ |
| 18:      $E(\tilde{G}) = E(\tilde{G}) \setminus (\tilde{v}_x, \tilde{v}^*)$ ▷ all edges involving $\tilde{v}_x$ |
| 19:    end for |
| 20:    for all $v_x$ covered by $v_y$ do |
| 21:      $E(\tilde{G}) = E(\tilde{G}) \setminus (\tilde{v}_y', \tilde{v}_x)$, where $\tilde{v}_y \cup \tilde{v}_y' = v_x$ |
| 22:    end for |
| 23: end while |
| 24: return $S_a^{sel}$, $S_b^{sel}$ |

Proof. Let G be a graph with vertices coming from matrices $S_{N-L}$ and edges between pairs of matrices that differ by a rows as shown on FIG. 10. It is relatively easy to show that the clique number of G will be ω(G)=(L+1)r and that each clique can be defined using a submatrix of the rows that are common in each of the matrices in the clique. Thus, the best covering set will be the set of submatrices that define each clique as this covers all matrices using the least amount of smaller matrices.

We have decided to follow the technique proposed in Subsection IV-B2 instead of this algorithm for the first step of a decomposition to ensure that if multiple minimum cost set covers exist (this is the case for r=1), the one that maximizes matrix reuse through memoization is selected.

Greedy Algorithm for Divide and Conquer:

We propose extending the previous algorithm to deal with the more general case when a matrix of size i×k is decomposed into two submatrices of size a×k and b×k, where a+b=i. FIG. 11 shows an example for a state of the algorithm. Graph G will maintain a pairing that denotes which submatrices cover which matrices. The set X will continue to be the matrices that need to be covered and Y will be all the possible submatrices of size a×k and b×k that can be built from elements of $S_1$. There is an edge between a vertex $v_x \in X$ and $v_y \in Y$ if and only if $v_y' = v_x \setminus v_y \notin Y$. When G is created, $v_y' \in Y$, therefore an edge in G will only appear if the pair $v_y'$ with which $v_y$ covers $v_x$ has already been selected. Unless a=1 or b=1, G has no edges in the beginning. In the special case where a=1 or b=1, G should be initialized as described in the previous subsection.

We introduce a second graph $\tilde{G}(\tilde{X}=X, \tilde{Y}=Y)$, to have a pairing that denotes which submatrices cover which matrices partially. $v_y \in \tilde{Y}$ partially covers $v_x \in \tilde{X}$ if $v_y' = v_x \setminus v_y \in \tilde{Y}$. These are submatrices, whose pairs have not yet been selected and thus can only provide partial cover for $v_x$. In the special case where a=1 or b=1, $\tilde{G}$ will have no edges and may be disregarded. In essence, the algorithm falls back to the decrease and conquer algorithm. Otherwise, it must be initialized to have all partially covering edges.

The algorithm selects submatrices from Y until all matrices in X have been covered. It selects the submatrix $v_y$ that has the highest degree in G, i.e. covers most matrices. Tie-breaks are common and are handled by selecting the submatrix that has the largest degree in $\tilde{G}$, i.e. partially covers most matrices. When a submatrix is selected, it is removed from both G and $\tilde{G}$. Furthermore, all matrices it covers are removed from both G and $\tilde{G}$ along with any edges they are part of. Any matrix $\tilde{v}_x$ it partially covered is updated in G: an edge is added between $v_x$ and $v'_y$ to reflect that $v'_y$ can now cover $v_x$.

With reference again to FIG. 11, there is an illustration for a state of the divide and conquer algorithm showing both graphs and the sets of already selected matrices. Some elements of Y and $\tilde{Y}$ have been omitted ( . . . ) due to space constraints. The next step would select and add {3,4} to $S_2^{sel}$ as it is tied with {1,2,3} in covering the most matrices in G and partially covers more matrices in $\tilde{G}$. The algorithm would then move {3,4}, {1,2,3,4,6} from G and $\tilde{G}$ along with all of their edges. It would then add an edge between {1,2,3,4,5} and {1,2,5} (not shown) in G to reflect that {1,2,5} now fully covers {1,2,3,4,5}.

Proposition 2. For every partially covered $v_x$ by the selected $v_y$, there will always be exactly one $v'_y$ that will cover $v_x$.

Proof. If it is supposed that no $v'_y$ exists, then it must have been previously selected. However, in this case $v_x$ would have already been fully covered by $v_y$. This is a contradiction. Furthermore, it is unique, because no two permutations of the same elements exist in Y.

Performing Invertability Checks Given a Decomposition:

A decomposition is only dependent on N, L, a, parameters that typically do not change during the lifetime of a system. Therefore, several decompositions can be computed in advance to cover the likely parameter set values before the system becomes operational to store data in storage nodes and repair failed nodes (i.e., before the system goes "online"). Thus, even if finding a good valid decomposition is computationally expensive, it does not negatively influence the general repair performance of the system. This subsection examines how a decomposition can be applied.

The Benefits of Performing Checks in a Top-Down Manner:

Given a valid decomposition D, either a bottom-up or a top-down approach can be used to do the checks. Bottom-up checks start with matrices from $S_1^{sel}$ and then reduce each matrix $s_i \in S_j^{sel}$ level-by-level to an upper triangular form and memoize it after merging two smaller matrices based on $\Psi$. This approach has the benefit of avoiding recursive calls, but will only provide relevant information on the rank of a matrix $s_m \in M$ after all smaller matrices $s_j \in s_j$, j<m have been reduced to an upper triangular form. Conversely, a top-down approach starts with matrices $s_m \in M$ and attempts to merge $s_m = s_a \otimes s_b$, where the choice of $s_a$ and $s_b$ is defined by $\Psi$. If either $s_a$ and/or $s_b$ are not yet in UTF, the algorithm is called recursively on $s_a$ and/or $s_b$ and so on. Once a matrix is reduced into UTF, it is memoized so it can be reused for other matrices from M. Thus, the invertability of some $s_m$ will be known earlier than using a bottom-up approach. This can be used to provide probabilistic statements on the overall result of the checks before all matrices are checked.

This is most important in situations where the checks of rank are time constrained. Either there are not enough free computational resources in the system and the checks must be postponed or two node failures occur in quick succession and a repair must be started before the checks for the second failure have time to complete. A more informed decision may still be able to be made on what repair to select based on the matrices that have been computed so far. The amount of useful information may be increased at any given point in time by using a top-down approach and ordering the matrices in M in a certain way. One possible ordering is to take one repair for each node failure first. Once at least one feasible repair is found for every failure, one more repair for each failure can be checked and so on. This minimizes the time until there is at least one feasible repair for every possible failure scenario. Alternatively, if it is acceptable for the system to temporarily go below the predetermined L number of concurrent node failures it must sustain, the matrices may be ordered differently. This case start by looking at a single repair for each node failure first. However, instead of completing all checks for that repair, one check at a time can be performed, moving on to check matrices associated with another node failure. With each pass, the degree of confidence that a repair is feasible for any L node losses increases. If a check fails, new coefficients can be generated the checks that have already been performed for the failed check can be repeated.

Memoizing Matrices Across Generations:

A further reduction in computations can be achieved if matrices from a decomposition are stored and reused across multiple generations. Any matrix that contains rows from the recently lost node should be discarded, but all others can be reused in the subsequent generation. The proposal to start a decomposition from $M=S_{N-L-1}$ encourages matrix reuse across generations as it ensures that only matrices containing rows from actual nodes (as opposed to rows from hypothetical repairs) are memoized. It is noted that the checks for the initial data distribution are slightly more expensive as they cannot reuse matrices from previous generations and no matrices can be skipped as there were no previous failures.

Coefficient Matrix Decomposition and Use Thereof

Embodiments directed to coefficient matrix decomposition and their use/application can be used with repair feasibility determination to check the rank of several coefficient matrices to determine whether data will be stored suitably following the future failure and recovery of a storage node in a DSS employing erasure coding. The embodiments include methods and algorithms to ensure this is performed efficiently, with a small number of computations.

First, a decomposition schema/blueprint/template is provided for each set of parameters (number of storage nodes; number of storage nodes that may be unavailable at the same time, with no impact on data recoverability; number of data fragments stored on a node) to determine how the rank of the coefficient matrices should be checked. This can be done before the DSS starts operating to encode, store, retrieve and repair data and is not tied to a single individual DSS. Two methods to find/identify good (i.e., effective) decompositions are proposed: decrease and conquer and divide and conquer. It is expected that over time more efficient decompositions may be discovered using other methods. Therefore, the embodiments enable a DSS to update the decomposition schemas it uses over a lifetime of the DSS.

Second, the decomposition schema is used to perform the actual rank checks efficiently. A top-down approach is presented for employing the decomposition, but other approaches may be used.

While rank checks on matrices are performed using the decomposition, intermediate smaller matrices that result from using the decomposition may be memoized, after they have been transformed into Upper Triangular Form (UTF). The merging operation creates a larger UTF matrix from two smaller, previously transformed and memoized UTF matrices.

Memoized matrices are stored for subsequent generations of node failure and recovery to further reduce the number of computations necessary when using the decomposition.

Assumptions/Initial Conditions:

The case of single concurrent node failure is treated herein because such a failure makes up the bulk of all long-term outages.

The treatment assumes that the DSS uses RLNC coding; however matrix rank checks/determinations (also referred to simply as "checks") can be performed for other types of linear block codes To be able to perform the checks, the coefficient matrices are made accessible to the component or group of components in the DSS that performs the required operations, e.g., node controllers and/or DSS management entity 104.

A feature of the embodiments is the reuse of UTF matrices through memoization, a technique that involves storing intermediate results, including UTF matrices, in memory for reuse later. Memory/storage requirements are modest, e.g., less than 10 MB in most practical systems. If more then one component performs the checks, some form of shared access memory is required. If the matrices are to be memoized between different generations of node failure and recovery over the lifetime of the DSS, some form of persistent storage should also be used as the expected time between two nodes failing may be long compared to the volatility of non-persistent memory.

The embodiments reduce the number of mathematical operations (divisions, subtractions and multiplications) performed on the individual elements of the coefficient matrices that need to be rank checked. These operations determine to a large degree the total computational cost of the rank checks.

Finding Effective Decompositions:

Operations to find good (i.e., effective) decompositions may be, but need not be, performed by the DSS while operating. For example, the operations may be performed as pre-compute or a priori operations before actually deploying and/or operating the DSS, provided certain information is known regarding which rows of coefficient matrices will encode data to which nodes in the DSS when it is deployed and operating.

A decomposition can be regarded as a data structure that defines the dependencies between matrices. The decomposition defines how larger matrices can be created by merging two smaller matrices ($s_m = s_a \otimes s_b$). Merging is the operation of copying the rows of two matrices into a single matrix and then carefully using the pivot elements of the first smaller matrix $s_a$ to reduce the resulting matrix $s_m$ into Upper Triangular Form (UTF).

Another goal of the embodiments is to reduce the total computational cost associated with mergers as described formally in the TREATISE. The embodiments achieve this by reusing submatrices in UTF that are shared between larger matrices. The determination of whether a row or group of rows can be shared is made based on their source rather than content, i.e., based on which node each row originates from. When a row of (coding) coefficients of a coefficient matrix is used to encode data into encoded fragments that is then stored on a given node, the row of coefficients and the node are said to be associated with each other, and the node is said to be the node (i.e., source) from which the row originates. Thus, the operation of finding decompositions is independent of the values that the coefficients in the rows will take when it is actually applied.

Given a set of matrices for which the rank must be checked, finding a decomposition that requires a small number of arithmetic operations related to the mergers is mathematically challenging. Fortunately, it is usually only be performed once, before the DSS starts operating. Then, the decomposition can be used as a schema/blueprint/template during normal operation of the DSS for doing the rank checks.

The embodiments include two decomposition methods: decrease and conquer reduces matrices one level at a time, whereas divide and conquer tries to break matrices into two matrices that are both half the size of the original, thus 'skipping' levels. Both methods have the same type of input and output:

a. Input: a set of node tuples that represent/define coefficient matrices that will need to be rank checked at DSS run time; where each node tuple represents/defines a coefficient matrix based on the one or more nodes on which data encoded by one or more rows of the matrix is/are stored, and the number of rows in the matrix that are used to encode the data for storage on the one or more nodes. For the decomposition, the storage nodes the rows of the matrix originate from define a matrix (i.e., the matrix is defined by the nodes associated with the rows of the matrix, as described above).

b. Output: a decomposition represented by a graph, such as that shown in FIG. 6, where the nodes of the graph are matrices and each node except those representing matrices with rows from a single storage node has two directed edges to the two smaller matrices that need to be merged to reach it. The top-level nodes represent the input matrices, the lower levels represent the smaller matrices that should be memoized in UTF. For convenience in describing the use of decompositions, a dummy starter node is added to connect to each of the nodes on the top level.

For both decomposition methods, the mathematically challenging part is finding the mapping between the matrices in levels $S_{i-1}$ and $S_i$ and $S_{i/2}$ and $S_{i/2}$ respectively. The invention proposes two greedy algorithms for this purpose.

Figure 12:
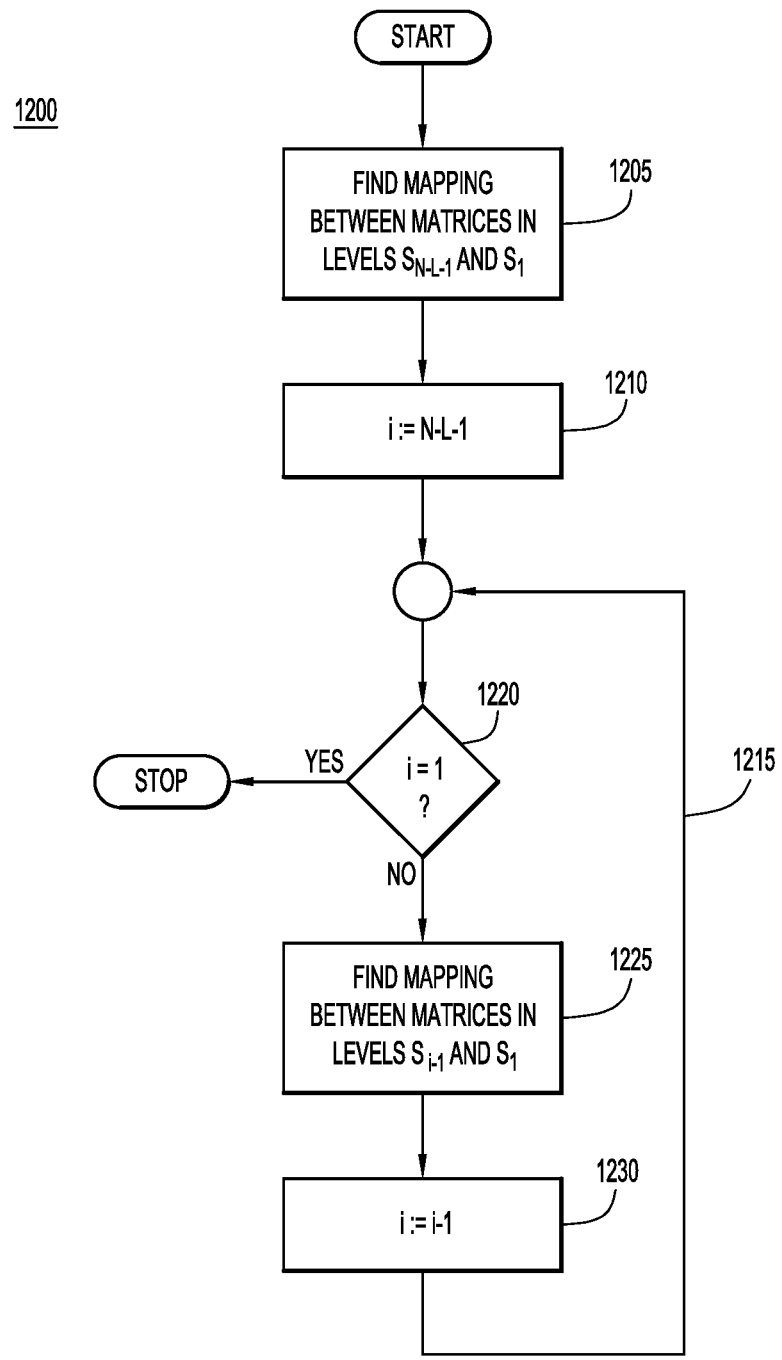
FIG. 12 is a flowchart of a method of generating a decomposition using decrease and conquer, according to an example embodiment.

With reference to FIG. 12, there is a flowchart of an example method 1200 of generating a decomposition using decrease and conquer. Method 1200 has the inputs (a) and the outputs (b) as described above. Method 1200 finds/identifies mappings in the decomposition, as described above in connection with FIG. 6. Generally, method 1200 traverses levels in the decomposition hierarchy, such as that shown in FIG. 6, incrementally from the highest level (e.g., matrices M that have data from 3 nodes) to the next level (submatrices that have data from 2 nodes), and so on. For each current level (generally indicated in FIG. 12 by the subscripts of "S"), method 1200 finds (i) the least number of submatrices that are down one level (i.e., one size smaller) and (ii) submatrices on the bottom level, which together can be used to build the matrix at the current level by merging. Generally, for each matrix, method 1200 identifies a submatrix on the lowest level and a submatrix only one level down from the given matrix/submatrix. The way the decomposition is constructed is backward or reversed from the way it is actually applied to check matrix ranks.

Operation 1205 finds mappings from matrices at the highest level of the hierarchy to the lowest level.

Operation 1210 decrements the level leading into a loop 1215, which repeats to find all remaining mappings of the decomposition.

In loop 1215: operation 1220 tests whether the current level being processed is the bottom level indicating the mappings are complete; operation 1225 finds the mappings from the current (intermediate) level to the lower levels; and operation 1230 decrements the current level.

Figure 13:
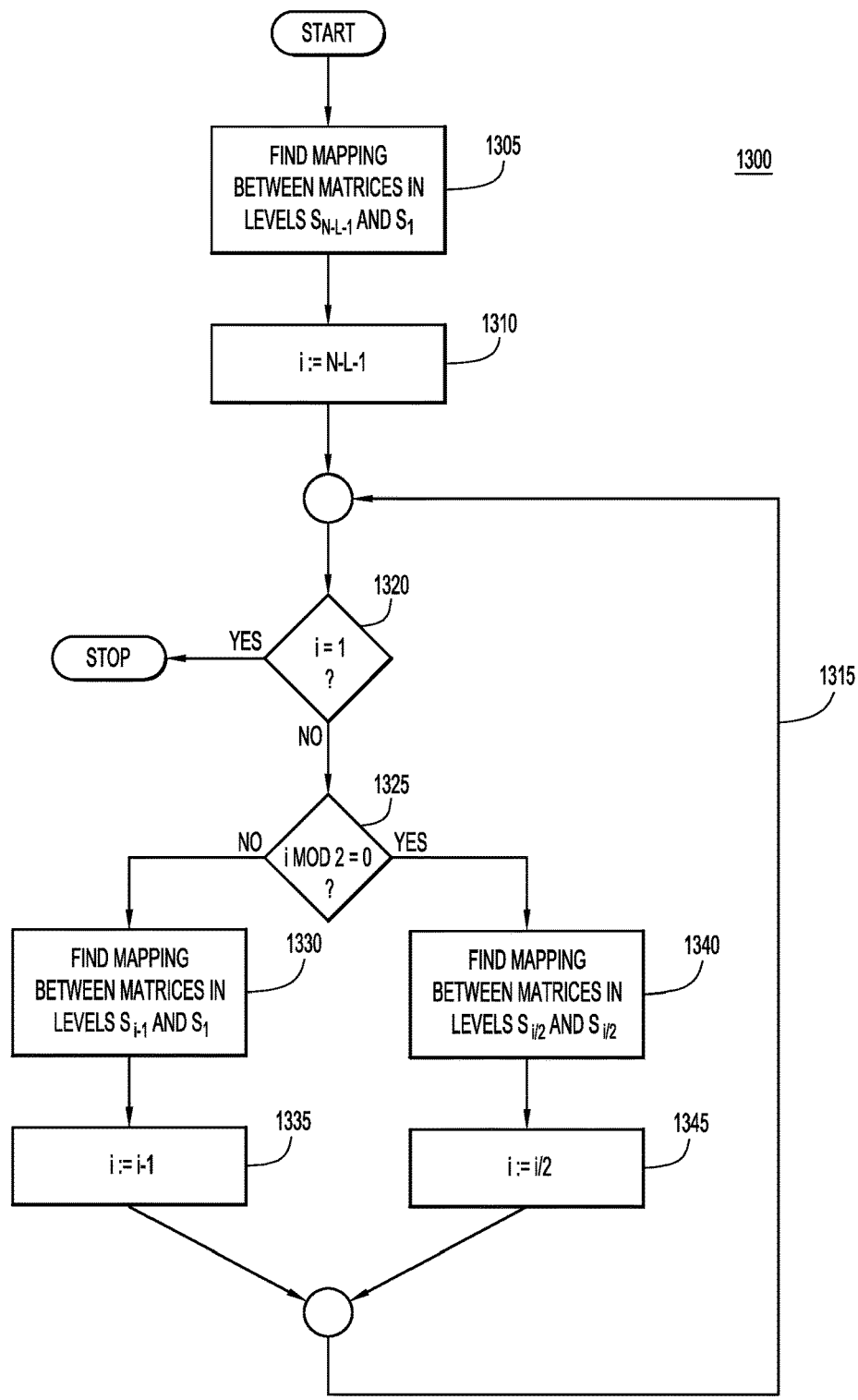
FIG. 13 is a flowchart of a method of generating a decomposition using divide and conquer, according to an example embodiment.

With reference to FIG. 13, there is a flowchart of an example method 1300 of generating a decomposition using divide and conquer. Method 1300 is similar to method 1200.

Operations 1305, 1310, and 1320 are similar to operations 1205, 1210, and 1220.

Loop 1315 does not traverse levels incrementally as in loop 1215. Instead, loop 1315 attempts to traverse levels in steps of divide-by-two. In loop 1315, operation 1325 tests whether the current level is an even level (i.e., is divisible by 2). If yes, flow proceeds to operations 1340 and 1345 in loop 1315, to find the mappings for that level. If no, flow proceeds to operations 1330 and 1335 to find mappings for that level. Operations 1320, 1335, and 1345, ensure that the levels are decremented and that the method stops when the current level is the bottom level.

Using/Applying a Decomposition to Check Matrix Rank:

To ensure that repair can be initiated as soon as a node fails, the set of feasible repairs can be pre-computed in advance. This operation is represented at operation 510 of FIG. 5A ("Node(s) Pre-Compute Feasible Repairs for Failure Scenarios"). In one embodiment, operation 510 is the operation where the decomposition is used to determine which repairs are feasible. The definition of a feasible repair is left somewhat open; it is assumed that a feasible repair should at least maintain the same level of resilience, i.e. the DSS should be able to recover data by accessing the same number of storage nodes as prior to the repair. A more stringent extension to this is the requirement that a repair must maintain and MDS-like property on individual rows. This ensures that noninvertible coefficient matrices do not increase the worst-case latency of read operations.

The decomposition schema is used/applied to determine which repairs are feasible. A top-down method may be used when applying the decomposition, as described below in connection with FIG. 14. This is basically a depth first traversal of the graph started from the dummy starter node that has a dependency on all the input matrices. Gaussian elimination is used to reduce into UTF the matrices that have rows of coefficients coming from a single node and merging for all others. Matrices in UTF are memoized if they do not contain any all-0 (i.e., "zero") rows. In subsequent steps of the operation, memoized matrices are reused to skip the costly reduction into UTF. Conversely, a bottom-up approach could also be used.

The memoized matrices can be stored, for example, in a hash table. A potential key for the hash table includes a string built by concatenating the identifiers (IDs) of the storage nodes from which the matrix has rows (i.e., the storage nodes that store data encoded using the rows of the matrix) and a separating character, such as a comma. The operation that uses the decomposition to check the matrix ranks has the following input and output:

a. Input: a set of matrices that contain the coefficients that would be present in the DSS following the potential repair of different storage nodes. Multiple repair strategies can be considered for each potential storage node failure.

b. Output: a list of matrices from the input set that do have a rank of at least k. A set of memoized, smaller matrices to be reused in subsequent iterations of this operation.

Each matrix from the output corresponds to a potential repair. If based on information theoretical results (such as those based on min-cut, max-flow arguments) the repair should have been feasible but the checks failed, a new set of coefficients can be generated for the failed repair and the decomposition used again, this time only with the newly generated matrices. All memoized matrices can be reused in this case.

Memoizing matrices may be performed across generations as a simple way to further decrease the computational cost of the checks over the lifetime of the DSS. Matrices containing rows from the previously failed node should be removed.

Although not explicitly shown on the flowchart, the top-level matrices need not be memoized.

Figure 14:
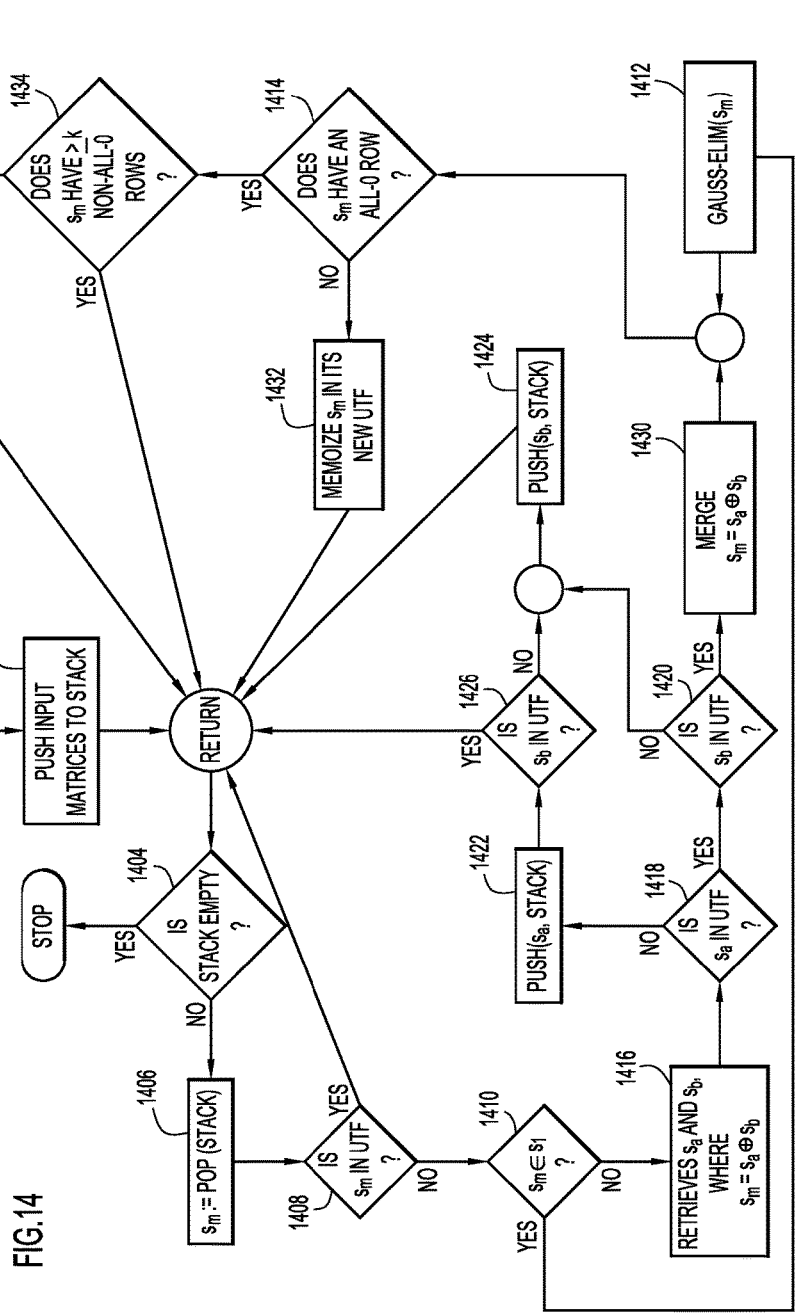
FIG. 14 is a flowchart of a method of applying a decomposition to check matrix rank, according to an example embodiment.

With reference to FIG. 14, there is a flowchart of a method 1400 of applying a decomposition to check matrix rank. Method 1400 transforms matrices at the highest level of the decomposition structure/matrix hierarchy to UTF using operations on submatrices according to the decomposition structure. Method 1400 has the inputs (a) and the outputs (b) as defined above. Method 1400 is performed by/in a DSS (e.g., DSS 100) while the DSS is deployed and operating to encode data, store encoded data, and access the encoded data, and recover data from failed nodes (i.e., perform repairs). One or more controllers in the DSS (e.g., controllers of nodes 102 and/or a controller of management entity 104) may perform method 1400.

At 1402, input matrices that need to be rank checked are pushed onto a stack that stores matrices and submatrices (referred to as "matrices" for the purposes of describing FIG. 14) to be processed. At 1404, it is determined whether the stack is empty indicating that there are no more matrices to be processed. If the stack is empty, method 1300 (the "process") ends. Otherwise, flow proceeds to 1406 where the next matrix ($s_m$) to be processed is accessed from the stack. While the stack is not empty, certain operations of method 1400 will repeat in a recursive manner.

At 1408, it is determined whether the matrix is already in UTF. If it is, then the process returns, to check the rank of the next matrix in the stack. Otherwise, the matrix needs to be transformed according to the decomposition, and flow proceeds to 1410.

At 1410, it is determined whether the matrix is associated/ from only one node, i.e., if it is a smallest matrix that occupies the bottom of the hierarchy. If it is, flow proceeds to 1412, where Gaussian elimination is performed on the matrix, and then flow proceeds to 1414.

On the other hand, if it is determined that the matrix is not associated with only one node, indicating that the matrix results from a merge of two smaller matrices, flow proceeds to 1416. Operation 1416 identifies the two smaller matrices ($s_a$) and ($s_b$) to be merged into the matrix ($s_m$) based on the decomposition (i.e., the edges of the decompositions pointing from the matrix to the two smaller matrices or submatrices).

Flow proceeds from 1416 to 1418 and 1420, where it is determined whether both of the smaller matrices are already in UTF form. If neither is in UTF form, both are pushed onto the stack at 1422 and 1424 and the process returns for a recursion. If only one of the smaller matrices is in UTF form, as determined at 1418, 1420, or 1426, the other one of the smaller matrices is pushed onto the stack to be processed in a recursion. Over time and multiple recursions, the size of both of the smaller matrices will be reduced down to the smallest size.

If, at 1418 and 1420, both of the smaller matrices are determined to be in UTF form, flow proceeds to 1430, where they are merged, and flow proceeds to 1414. The merge operation operates on actual coding coefficient values of the matrices being merged.

At 1414, it is determined whether the matrix resulting from 1430 or the matrix resulting from 1412 has an all-0 row. If it does not, flow proceeds to 1432, where the matrix is memoized in its UTF form, and the process ends, for that matrix. The matrix may be memoized in a hash table that uses a key in the form of the identifiers of the nodes associated with the rows of the memoized matrix. Memoization does not store matrices to the stack because the stack is reserved for matrices that need to be further processed. Once memoized to the hash table, the matrix can be reused if fetched in accordance with the decomposition (e.g., as identified by the edges and tuples of the decomposition). Memoized matrices, if available, may be fetched in next, recursive passes through retrieval operation 1416.

If the matrix does have an all-0 row, flow proceeds to 1434, where it is determined whether the matrix has a number of rows with at least one non-0 element greater than or equal to k. If yes, the rank check of that matrix is done and the process returns. If no, flow proceeds to 1440, where the matrix is added to a list of matrices for which the matrix rank check has failed, after which the process returns. Method 1400 repeats recursively from the return until the decomposition has been traversed and the stack is empty, i.e., until all of the matrices on the stack have been checked.

Figure 15:
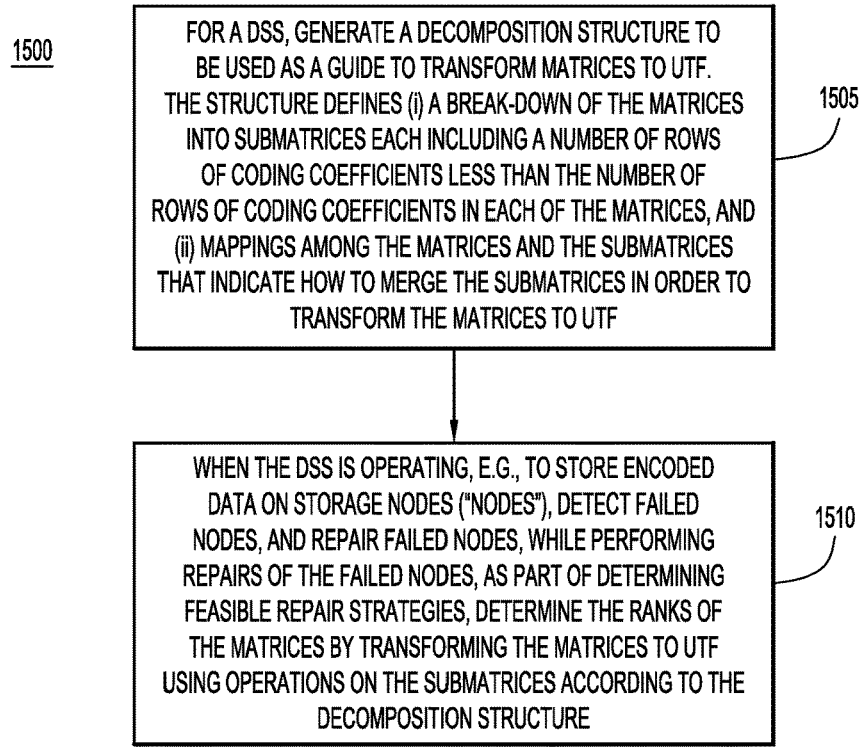
FIG. 15 is a flowchart of a method of generating a decomposition of coefficient matrices and applying the decomposition in the DSS, according to an example embodiment.

With reference to FIG. 15, there is a flowchart of an example method 1500 of generating a decomposition of coefficient matrices and then applying the decomposition in DSS 100. Method 1500 may be performed by one or more controllers in DSS 100, such as controller 400, configured to communicate with storage nodes 102. The controller may be local to one of storage nodes 102, or incorporated in DSS management entity 104, and is associated with/has access to erasure codes used to encode source data onto the storage nodes and to decode the encoded data. When DSS 100 is operating to encode data, store encoded data on storage nodes 102, access the encoded data, detect failed ones of the storage nodes, and repair the failed storage nodes, the controller determines ranks of appropriate matrices having rows of coding coefficients related to the erasure codes to ascertain whether repairs of failed storage nodes in DSS 100 are feasible. To determine the ranks of the matrices, the controller transforms the matrices to UTF.

At 1505, the controller generates a decomposition (referred to as a "decomposition structure") to be used to transform the coefficient matrices to UTF for use in computing ranks. The decomposition structure serves as a guide for transforming the matrices to UTF (and thus computing the ranks) in an efficient manner. The decomposition structure defines (i) a break-down of the matrices into submatrices each including a number of rows of coding coefficients less than the number of rows of coding coefficients in each of the matrices (and each associated with a number of storage nodes less than a number of storage nodes associated with each of the matrices), and (ii) mappings among the matrices and the submatrices that indicate how to merge the submatrices, once converted to UTF, so as to create the matrices in UTF, i.e., how to merge the submatrices to transform the matrices to UTF. In the example of FIG. 6, the decomposition structure comprising matrices D with interconnecting edges breaks-down matrices M into submatrices, and provides mappings between the matrices and the submatrices.

Operation 1505 may be performed independently of whether DSS 100 is operating. For example, operation 1505 may be performed prior to when DSS 100 is deployed and/or operating, so long as certain information related to the matrices is known. That information includes, for each matrix to be decomposed, the identities of/identifiers for the one or more storage nodes 102 that will store data encoded with the rows of coefficients from the matrix, and the number of rows used to encode that data. This information is used to define the matrices and submatrices in the decomposition structure without using actual values of the coefficients themselves. That is, the actual coefficient values used in the rows of the matrix need not be known or used in operation 1505.

Operation 1505 may be performed using either of methods 1200 and 1300, for example.

At 1510, when/while DSS 100 is actually operating, while the DSS performs repairs of the failed storage nodes, as part of determining feasible repairs that will preserve subsequent repairs of failed nodes, the controller computes/determines the ranks of the coefficient matrices by transforming the matrices to UTF using operations on the submatrices according to the decomposition structure, i.e., the decomposition structure guides the transforming. Operation 1510 may be performed using method 1400, for example.

Figure 16:
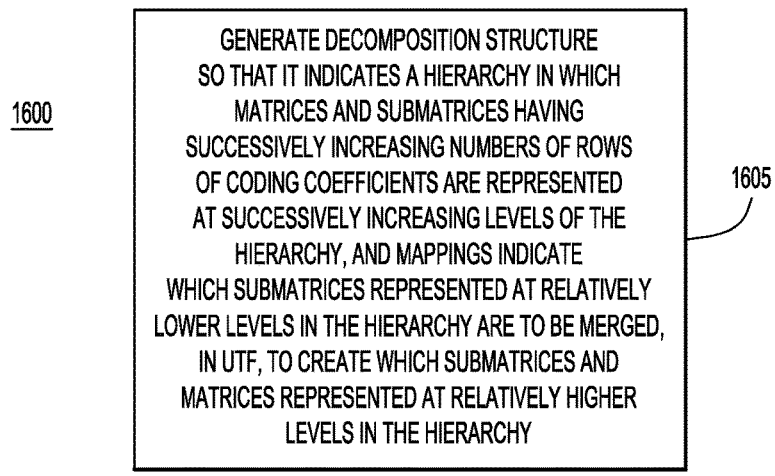
FIG. 16 is a flowchart of a method used for generating the decomposition structure in the method of FIG. 15, according to an example embodiment.

With reference to FIG. 16, there is a flowchart of an example method 1600 used for generating the decomposition structure in operation 1505. At 1605, the controller (e.g., of a node 102 or management entity 104) generates the decomposition structure such that the break-down of the matrices into the submatrices indicates a multi-level matrix hierarchy in which the matrices and the submatrices having successively increasing numbers of rows of coding coefficients (and that are associated with successively increasing numbers of storage nodes 102) are represented at successively increasing levels of the hierarchy, and the mappings indicate which submatrices represented at lower levels in the hierarchy are to be merged, in UTF, to create which submatrices and matrices represented at relatively higher levels in the hierarchy. FIG. 6 shows an example three-level hierarchy, with matrices M at a top level of the hierarchy and the submatrices at lower levels of the hierarchy.

Figure 17:
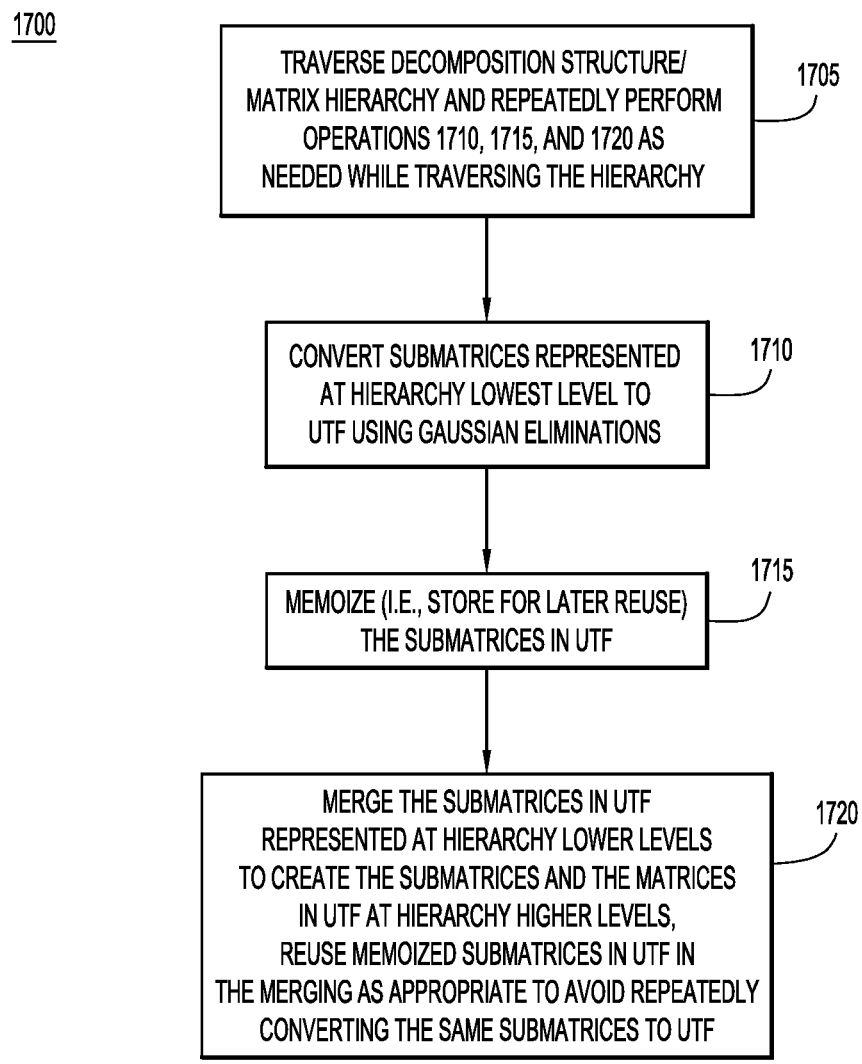
FIG. 17 is a flowchart of a method used for transforming the decomposition structure, according to an example embodiment.

With reference to FIG. 17, there is a flowchart of an example method 1700 used for transforming the decomposition structure in operation 1510.

At 1705, to transform the decomposition structure, the controller (e.g., of a node 102 or management entity 104) traverses the hierarchy of the decomposition structure and, while traversing the hierarchy (e.g., traversing vertices and edges in the hierarchy), repeatedly performs operations 1710-1720 as necessary.

At 1710, the controller converts the submatrices represented at the lowest level of the hierarchy to UTF using Gaussian eliminations.

At 1715, the controller memoizes the submatrices in UTF from 1705.

At 1720, the controller merges the submatrices in UTF represented at the lower levels of the hierarchy to create the submatrices and the matrices in UTF at the relatively higher levels of the hierarchy. In this operation, memoized ones of the submatrices in UTF are reused for merges as appropriate to avoid repeatedly converting the same submatrices to UTF.

Method 1700 may be performed using method 1400.

In summary, based on embodiments directed to the above-described decomposition and use thereof, a simplified version of Gaussian elimination can be used to check the rank of a matrix. The embodiments transform the matrix into row echelon (upper triangular) form by doing division, multiplication and addition operations on the matrix elements.

The matrices to be checked often contain many of the same rows. This permits decomposing the Gaussian elimination into smaller steps to create submatrices that are in row echelon form. These smaller steps can be performed individually and the submatrices can be stored (memoized) so they can be reused for other checks. This eliminates any duplicate computations on rows shared among matrices.

It is also possible to memoize submatrices across several generations of node failure and recovery, thus further increasing the effectiveness of our solution.

The techniques presented herein take advantage of the fact that many of the computations involved in selecting feasible repairs for a distributed storage system employing codes with randomly selected coefficients are redundant. Techniques from the arsenal of dynamic programming, such as memoization and decrease/divide and conquer, are used to avoid this redundancy. The net effect is a significant reduction in the computational load on the DSS and in the time required to select a repair plan to deal with failing storage nodes. Firstly, the techniques reduce the time required to select a feasible repair strategy following a node failure. This increases the reliability of the system. Secondly, the techniques increase the set of practically feasible parameters for an erasure code and data distribution. This increased flexibility in designing a DSS allows engineers to optimize other parameters of the system. Thirdly, the techniques reduces CPU load on the system. The checks themselves as implemented herein give strong guarantees on data recoverability and reduce jitter in read latencies. Large gains for many frequently used codes are possible.

In summary, in one form, a method is provided comprising: at a controller device configured to communicate with storage nodes of a distributed storage system in which erasure codes are used to encode source data onto the storage nodes and ranks of matrices containing coding coefficients associated with the erasure codes indicate whether repairs of failed storage nodes of the distributed storage system are feasible: generating a decomposition structure to be used as a guide for transforming the matrices to upper triangle form (UTF) for use in computing the ranks of the matrices, wherein the decomposition structure defines (i) a breakdown of the matrices into submatrices each including a number of rows of coding coefficients less than the number of rows of coding coefficients in each of the matrices, and (ii) mappings among the matrices and the submatrices that indicate how to merge the submatrices in order to transform the matrices to UTF; and while the distributed storage system is performing repairs of the failed storage nodes, as part of determining feasible repair strategies for subsequent repairs of failed storage nodes, computing the ranks of the matrices by transforming the matrices to UTF using operations on the submatrices according to the decomposition structure.

In another form, an apparatus is provided comprising: a network interface unit configured to communicate over a network with storage nodes of a distributed storage system in which erasure codes are used to encode source data onto the storage nodes and ranks of matrices containing coding coefficients associated with the erasure codes indicate whether repairs of failed storage nodes of the distributed storage system are feasible; and a processor coupled to the network interface unit and configured to: generate a decomposition structure to be used as a guide for transforming the matrices to upper triangle form (UTF) for use in computing the ranks of the matrices, wherein the decomposition structure defines (i) a break-down of the matrices into submatrices each including a number of rows of coding coefficients less than the number of rows of coding coefficients in each of the matrices, and (ii) mappings among the matrices and the submatrices that indicate how to merge the submatrices in order to transform the matrices to UTF; and while the distributed storage system performs repairs of the failed storage nodes, as part of determining feasible repair strategies for subsequent repairs of failed storage nodes, computing the ranks of the matrices by transforming the matrices to UTF using operations on the submatrices according to the decomposition structure.

In yet another form, a processor readable medium is provided to store instructions that, when executed by a processor of a controller device configured to communicate with storage nodes of a distributed storage system in which erasure codes are used to encode source data onto the storage nodes and ranks of matrices containing coding coefficients associated with the erasure codes indicate whether repairs of failed storage nodes of the distributed storage system are feasible, cause the processor to: generate a decomposition structure to be used as a guide for transforming the matrices to upper triangle form (UTF) for use in computing the ranks of the matrices, wherein the decomposition structure defines (i) a break-down of the matrices into submatrices each including a number of rows of coding coefficients less than the number of rows of coding coefficients in each of the matrices, and (ii) mappings among the matrices and the submatrices that indicate how to merge the submatrices in order to transform the matrices to UTF; and while the distributed storage system is performing repairs of the failed storage nodes, as part of determining feasible repair strategies for subsequent repairs of failed storage nodes, compute the ranks of the matrices by transforming the matrices to UTF using operations on the submatrices according to the decomposition structure.

The above description is intended by way of example only. Various modifications and structural changes may be made therein without departing from the scope of the concepts described herein and within the scope and range of equivalents of the claims.

What is claimed is:

1. A method comprising:
    at a controller device configured to communicate with storage nodes of a distributed storage system in which erasure codes are used to encode source data onto the storage nodes and ranks of matrices containing coding coefficients associated with the erasure codes indicate whether repairs of failed storage nodes of the distributed storage system are feasible:
        generating a decomposition structure to be used as a guide for transforming the matrices to upper triangle form (UTF) for use in computing the ranks of the matrices, wherein the decomposition structure defines (i) a break-down of the matrices into submatrices each including a number of rows of coding coefficients less than the number of rows of coding coefficients in each of the matrices, and (ii) mappings among the matrices and the submatrices that indicate how to merge the submatrices in order to transform the matrices to UTF; and
        while the distributed storage system is performing repairs of the failed storage nodes, as part of determining feasible repair strategies for subsequent repairs of failed storage nodes, computing the ranks of the matrices by transforming the matrices to UTF using operations on the submatrices according to the decomposition structure.

2. The method of claim 1, wherein the transforming includes:
    converting at least some of the submatrices defined in the decomposition structure to UTF using Gaussian eliminations; and
    merging appropriate ones of the submatrices in UTF with each other as indicated by the mappings to create the matrices in UTF.

3. The method of claim 2, wherein the generating the decomposition structure is performed without using values of the coding coefficients, whereas the Gaussian eliminations on the submatrices and the merging are each performed using the values of the coding coefficients.

4. The method of claim 2, wherein the transforming further includes:
memoizing at least some of the submatrices converted to UTF; and
using the memoized submatrices in UTF in the merging as appropriate to avoid repeatedly converting the same submatrices to UTF using Gaussian elimination.

5. The method of claim 2, wherein the transforming using the converting and the merging according to the decomposition structure is computationally more efficient than transforming the matrices to UTF directly using Gaussian eliminations.

6. The method of claim 1, wherein the generating includes generating the decomposition structure so that the break-down of the matrices into the submatrices indicates a matrix hierarchy in which the matrices and the submatrices having successively increasing numbers of rows of coding coefficients are represented at successively increasing levels of the matrix hierarchy, and the mappings indicate which of the submatrices represented at lower levels in the matrix hierarchy are to be merged in UTF to create which of the submatrices and the matrices represented at relatively higher levels in the matrix hierarchy.

7. The method of claim 6, wherein the transforming further includes traversing the matrix hierarchy and, while traversing the matrix hierarchy, repeatedly:
converting the submatrices represented at the lowest level to UTF using Gaussian eliminations;
memoizing the submatrices in UTF; and
merging the submatrices in UTF represented at the relatively lower levels of the matrix hierarchy to create the submatrices and the matrices in UTF at the relatively higher levels of the matrix hierarchy,
wherein memoized ones of the submatrices in UTF are reused in the merging as appropriate to avoid repeatedly converting the same submatrices to UTF.

8. The method of claim 1, wherein the decomposition structure defines each matrix among the matrices and the submatrices by identifiers of all of the storage nodes on which data encoded using one or more rows of coding coefficients of that matrix are to be stored, and a total number of the one or more rows, without reference to actual values of the coding coefficients.

9. The method of claim 1, further comprising: prior to the performing the repairs, performing the generating the decomposition structure.

10. The method of claim 1, further comprising:
detecting the failed nodes; and
repairing the failed nodes based on the erasure codes.

11. An apparatus comprising:
a network interface unit configured to communicate over a network with storage nodes of a distributed storage system in which erasure codes are used to encode source data onto the storage nodes and ranks of matrices containing coding coefficients associated with the erasure codes indicate whether repairs of failed storage nodes of the distributed storage system are feasible; and
a processor coupled to the network interface unit and configured to:
generate a decomposition structure to be used as a guide for transforming the matrices to upper triangle form (UTF) for use in computing the ranks of the matrices, wherein the decomposition structure defines (i) a break-down of the matrices into submatrices each including a number of rows of coding coefficients less than the number of rows of coding coefficients in each of the matrices, and (ii) mappings among the matrices and the submatrices that indicate how to merge the submatrices in order to transform the matrices to UTF; and
while the distributed storage system performs repairs of the failed storage nodes, as part of determining feasible repair strategies for subsequent repairs of failed storage nodes, compute the ranks of the matrices by transforming the matrices to UTF using operations on the submatrices according to the decomposition structure.

12. The apparatus of claim 11, wherein the transforming includes:
converting at least some of the submatrices defined in the decomposition structure to UTF using Gaussian eliminations; and
merging appropriate ones of the submatrices in UTF with each other as indicated by the mappings to create the matrices in UTF.

13. The apparatus of claim 12, wherein the transforming further includes:
memoizing at least some of the submatrices converted to UTF; and
using the memoized submatrices in UTF in the merging as appropriate to avoid repeatedly converting the same submatrices to UTF using Gaussian elimination.

14. The apparatus of claim 11, wherein the processor is configured to generate the decomposition structure so that the break-down of the matrices into the submatrices indicates a matrix hierarchy in which the matrices and the submatrices having successively increasing numbers of rows of coding coefficients are represented at successively increasing levels of the matrix hierarchy, and the mappings indicate which of the submatrices represented at lower levels in the matrix hierarchy are to be merged in UTF to create which of the submatrices and the matrices represented at relatively higher levels in the matrix hierarchy.

15. The apparatus of claim 14, wherein the transforming further includes traversing the matrix hierarchy and, while traversing the matrix hierarchy, repeatedly:
converting the submatrices represented at the lowest level to UTF using Gaussian eliminations;
memoizing the submatrices in UTF; and
merging the submatrices in UTF represented at the relatively lower levels of the matrix hierarchy to create the submatrices and the matrices in UTF at the relatively higher levels of the matrix hierarchy,
wherein memoized ones of the submatrices in UTF are reused in the merging as appropriate to avoid repeatedly converting the same submatrices to UTF.

16. The apparatus of claim 11, wherein the decomposition structure defines each matrix among the matrices and the submatrices by identifiers of all of the storage nodes on which data encoded using one or more rows of coding coefficients of that matrix is to be stored, and a total number of the one or more rows, without reference to actual values of the coding coefficients.

17. A non-transitory processor readable medium storing instruction that, when executed by a processor of a controller device configured to communicate with storage nodes of a distributed storage system in which erasure codes are used to encode source data onto the storage nodes and ranks of matrices containing coding coefficients associated with the erasure codes indicate whether repairs of failed storage nodes of the distributed storage system are feasible, cause the processor to:

generate a decomposition structure to be used as a guide for transforming the matrices to upper triangle form (UTF) for use in computing the ranks of the matrices, wherein the decomposition structure defines (i) a breakdown of the matrices into submatrices each including a number of rows of coding coefficients less than the number of rows of coding coefficients in each of the matrices, and (ii) mappings among the matrices and the submatrices that indicate how to merge the submatrices in order to transform the matrices to UTF; and while the distributed storage system is performing repairs of the failed storage nodes, as part of determining feasible repair strategies for subsequent repairs of failed storage nodes, compute the ranks of the matrices by transforming the matrices to UTF using operations on the submatrices according to the decomposition structure.

18. The non-transitory processor readable medium of claim 17, wherein the instructions to cause the processor to perform the transforming include instructions to cause the processor to:

convert at least some of the submatrices defined in the decomposition structure to UTF using Gaussian eliminations; and merge appropriate ones of the submatrices in UTF with each other as indicated by the mappings to create the matrices in UTF.

19. The non-transitory processor readable medium of claim 18, wherein the instructions to cause the processor to perform the transforming further include instructions to cause the processor to:

memoize at least some of the submatrices converted to UTF; and use the memoized submatrices in UTF in the merge operation as appropriate to avoid repeatedly converting the same submatrices to UTF using Gaussian elimination.

20. The non-transitory processor readable medium of claim 17, wherein the instructions to cause the processor to generate include instructions to cause the processor to generate the decomposition structure so that the break-down of the matrices into the submatrices indicates a matrix hierarchy in which the matrices and the submatrices having successively increasing numbers of rows of coding coefficients are represented at successively increasing levels of the matrix hierarchy, and the mappings indicate which of the submatrices represented at lower levels in the matrix hierarchy are to be merged in UTF to create which of the submatrices and the matrices represented at relatively higher levels in the matrix hierarchy.

\* \* \* \* \*